(12) United States Patent
Ohkubo

(10) Patent No.: US 6,959,026 B2
(45) Date of Patent: Oct. 25, 2005

(54) SEMICONDUCTOR LASER ELEMENT AND PROCESS FOR PRODUCING THE SAME

(75) Inventor: Nobuhiro Ohkubo, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 266 days.

(21) Appl. No.: 10/327,862

(22) Filed: Dec. 26, 2002

(65) Prior Publication Data
US 2003/0128730 A1    Jul. 10, 2003

(30) Foreign Application Priority Data
Dec. 27, 2001 (JP) ............................ 2001-397537

(51) Int. Cl.[7] ............................................. H01S 5/00
(52) U.S. Cl. ...................................................... 372/46.01
(58) Field of Search ............................... 372/43.01–50

(56) References Cited

U.S. PATENT DOCUMENTS

| | | | | |
|---|---|---|---|---|
| 5,242,856 A | * | 9/1993 | Kurihara et al. | 438/33 |
| 5,742,631 A | * | 4/1998 | Paoli | 372/50 |
| 5,764,669 A | * | 6/1998 | Nagai | 372/45 |
| 6,614,821 B1 | * | 9/2003 | Jikutani et al. | 372/43 |
| 6,633,597 B1 | * | 10/2003 | Abe | 372/45 |
| 6,670,202 B2 | * | 12/2003 | Watanabe | 438/20 |
| 6,795,480 B1 | * | 9/2004 | Kaya et al. | 372/99 |
| 6,810,055 B2 | * | 10/2004 | Ohkubo | 372/46 |
| 2004/0066822 A1 | * | 4/2004 | Ohkubo | 372/46 |

FOREIGN PATENT DOCUMENTS

| | | | | |
|---|---|---|---|---|
| JP | 08-083954 | 3/1996 | | |
| JP | 09-023037 | 1/1997 | | |
| JP | 2000-208872 | 7/2000 | | |
| JP | 2001044567 A | * | 2/2001 | ......... H01S 05/227 |
| JP | 2001-230491 | 8/2001 | | |
| JP | 2002-261387 | 9/2002 | | |

* cited by examiner

*Primary Examiner*—Minounch Harvey
*Assistant Examiner*—Phillip Nguyen
(74) *Attorney, Agent, or Firm*—Morrison & Foerster LLP

(57) ABSTRACT

In a semiconductor laser element, a semiconductor layer interface 116 containing oxygen atoms is present above an active layer 103 in at least an internal region of a laser resonator. Also, the peak wavelength of photoluminescence of the active layer 103 in regions in the vicinity of end faces of the laser resonator is made shorter than that of the active layer in the internal region of the laser resonator. In the internal region of the laser resonator, vacancies (crystal defects) produced above and in the neighborhood of the semiconductor layer interface containing oxygen atoms are captured at this semiconductor layer interface. Diffusion of the vacancies to the active layer is thus suppressed.

20 Claims, 18 Drawing Sheets

SEMICONDUCTOR LASER ELEMENT AND PROCESS FOR PRODUCING THE SAME

BACKGROUND OF THE INVENTION

The present invention relates to a semiconductor laser element used for optical disks, and a process for producing the same. In particular, it relates to a window-structure semiconductor laser element having excellent high-output operation characteristics, and a process for producing the same.

In recent years, various types of semiconductor lasers have been widely used as light sources for optical disc devices. Particularly, high-output semiconductor lasers are used as light sources for writing on disks in MD (mini disk) players, CD-R (recordable) drives, and so on, and a further increase in the output is strongly demanded.

One of factors that restrict an increase in the output of the semiconductor lasers is a catastrophic optical damage (COD) incidental to the increase of the optical power density in an active layer region in the vicinity of end faces of a laser resonator.

The occurrence of the COD is attributed to the fact that the active layer region in the vicinity of the end faces of the laser resonator acts as a laser light absorbing region. At the end faces of the laser resonator, there are many non-radiative recombination centers referred to as a surface state or interface state. Carriers injected into the active layer in the vicinity of the end faces of the laser resonator disappear by the non-radiative recombination. The injection carrier density of the active layer is lower in the vicinity of the end faces of the laser resonator than in the central part thereof.

As a result, regions of the active layer in the vicinity of the end faces of the laser resonator become absorbing regions with respect to the wavelength of laser light produced by the high injection carrier density of the central part of the active layer.

The higher the optical output density, the greater the local heat generation in the absorbing region. The temperature rises, and the band-gap energy (bandgap width) is reduced. As a result, there takes place a positive feedback in which the absorption coefficient further increases, which in turn causes an increase of the temperature. The temperature of the absorbing regions in the vicinity of the end faces of the laser resonator eventually reaches a melting point, which results in the occurrence of a COD.

In order to solve the problem of the COD, a technique using a window structure formed by disordering a multi-quantum well-structured active layer, which is described in JP-A-9-23037, has been taken as a method of increasing the output of a semiconductor laser.

The structure of a semiconductor laser element described in JP-A-9-23037 is shown in FIG. 12, FIG. 13 and FIG. 14 as an example of a prior art semiconductor laser having such a window structure FIG. 12 is a perspective view of the semiconductor laser element, showing an end face of a laser resonator 1020. FIG. 14 is a cross sectional view taken along line XIV—XIV of FIG. 12, showing a waveguide. FIG. 13 is a cross sectional view taken along line XIII—XIII of FIG. 12 in the direction of layer thickness. In FIG. 12, reference numeral 1001 indicates a GaAs substrate, reference numeral 1002 indicates an n-type AlGaAs lower cladding layer, reference numeral 1003 indicates a quantum well active layer, 1004a indicates a p-type AlGaAs first upper cladding layer, 1004b indicates a p-type AlGaAs second upper cladding layer, and 1005 indicates a p-type GaAs contact layer. Also, reference numeral 1006 (a hatched part) indicates a vacancy diffusion region, 1007 (a hatched part) indicates a protons-injected region, 1008 indicates an n-side electrode, and 1009 indicates a p-side electrode. Also, reference numeral 1020 indicates an end face of a laser resonator, 1003a indicates a region contributing to laser oscillation in the quantum well active layer 1003, 1003b indicates a window-structured region of the quantum well active layer 1003 formed in the vicinity of the end face 1020 of the laser resonator.

Next, a process for producing the conventional semiconductor laser element will be described with reference to a flowchart shown in FIG. 15A through FIG. 15D.

On an n-type GaAs substrate 1001, an n-type AlGaAs lower cladding layer 1002, a quantum well active layer 1003, and a p-type AlGaAs first upper cladding layer 1004a are epitaxially grown in sequence (FIG. 15A).

Next, an $SiO_2$ film 1010 is formed on a surface of the p-type AlGaAs first upper cladding layer 1004a, and the film 1010 is formed with a stripe-shaped opening 1010a extending in the lengthwise direction of a laser resonator without reaching end faces of the resonator (FIG. 15B).

Then, the wafer is annealed at a temperature of at least 800° C. in arsenic atmosphere, whereby Ga atoms are absorbed into the $SiO_2$ film 1010 through the surface of the p-type AlGaSd first upper cladding layer 1004a which is in contact therewith, and Ga holes are produced in the p-type AlGaAs first upper cladding layer 1004a. The Ga vacancies or holes are diffused to reach the quantum well active layer 1003 in the inside of crystals, thereby disordering the quantum well structure. Since an effective width of the forbidden band is widened in the disordered active layer region, the active layer region functions as a transparent window for oscillated laser light.

Thereafter, the $SiO_2$ film 1010 is removed and then a p-type AlGaAs second upper cladding layer 1004b, and a p-type GaAs contact layer 1005 are epitaxially grown in sequence on the p-type AlGaAs first upper cladding layer 1004a (FIG. 15C).

Next, a resist film is formed on the p-type GaAs contact layer 1005, and using a photolithography technique, the resist film is shaped into a stripe 1011 in a region corresponding to the stripe-shaped opening in the $SiO_2$ film 1010.

Then, using as a mask this stripe-shaped resist 1011, protons are injected from the top surface side of the p-type GaAs contact layer 1005, whereby a high-resistance region 1007 that is to be a current block layer is formed.

Lastly, an n-side electrode 1008 is formed on the rear side of the GaAs substrate 1001, while a p-side electrode 1009 is formed on the p-type GaAs contact layer 1005, and then the wafer is cleaved to obtain semiconductor laser elements of the structure shown in FIG. 12.

In the conventional window-structured semiconductor laser element, as described above, the $SiO_2$ film 1010 is formed on the top surface of the p-type AlGaAs first upper cladding layer 1004a. Then, production of Ga holes in the p-type AlGaAs first upper cladding layer 1004a, with which the $SiO_2$ film 1010 is in contact, and Ga vacancy diffusion toward the quantum well active layer 1003 takes place. Thereby, the bandgap energy in the disordered regions formed in the vicinity of the end faces of the laser resonator is made larger than bandgap energy corresponding to the laser oscillation wavelength.

The production and diffusion of Ga vacancies or holes are supposed to take place in regions covered by the $SiO_2$ film 1010. However, if annealing is performed at 800° C. or higher, Ga holes are produced, though a little, in the uppermost surface of a region that is not covered by the $SiO_2$ film

1010 (an internal region of the laser resonator) due to re-evaporation of Ga atoms, and the Ga holes are diffused to the quantum well active layer 1003*a*.

This will invite a variation in the peak wavelength of the photoluminescence in the internal region of the laser resonator and a deterioration in the long-term reliability due to deterioration of crystallinity of the quantum well active layer.

If the annealing temperature is lowered or the annealing time is shortened, diffusion of Ga holes to the quantum well active layer 1003*a* in the internal region of the laser resonator can be suppressed, but production of holes and diffusion of the holes to the quantum well active layer 1003*b* in the region covered by the $SiO_2$ film 1010 become insufficient. Consequently, laser light is absorbed in the region in the vicinity of the end faces of the laser resonator.

Accordingly, the COD is liable to occur in the active layer region in the vicinity of the end faces of the laser resonator, which in turn causes a reduction in the maximum optical output in the high-power operation. Thus, sufficient long-term reliability cannot be obtained.

SUMMARY OF THE INVENTION

It is an object of this invention to provide a semiconductor laser element and a process for producing the same, which laser element can suppress a variation in the peak wavelength of the photoluminescence in an internal region of a laser resonator, and which is superior in long-term reliability.

In order to accomplish the above object, there is provided, according to an aspect of the present invention, a semiconductor laser element comprising a semiconductor substrate, an active layer formed above the semiconductor substrate, and a plurality of semiconductor layers laid on the active layer, wherein a semiconductor layer interface containing oxygen atoms is located above the active layer at least in an internal region of a laser resonator of the semiconductor laser element; and a peak wavelength of photoluminescence of the active layer in a region in the vicinity of an end face of the laser resonator is shorter than a peak wavelength of photoluminescence of the active layer in the internal region of the laser resonator.

The peak wavelength of photoluminescence of the active layer in the region in the vicinity of the end face may be made shorter than that of the active layer in the internal region by diffusing vacancies into the active layer in the region in the vicinity of the end face of the laser resonator.

According to the present invention, in the semiconductor laser element wherein the active layer is formed above the semiconductor substrate and the semiconductor layers are laid on the active layer, the semiconductor layer interface containing oxygen atoms is present above the active layer at least in the internal region of the laser resonator. Therefore, crystal defects present in the neighborhood of the semiconductor layer interface containing oxygen atoms tend to bond to the oxygen atoms present at the semiconductor layer interface for better stabilization. Accordingly, the crystal defects are liable to be deposited or precipitated at the semiconductor layer interface containing oxygen atoms.

Vacancies, or holes, which is one of crystal defects, produced above and in proximity to the semiconductor layer interface containing oxygen atoms, are captured at the semiconductor layer interface containing oxygen atoms in the internal region of the laser resonator. Thereby, diffusion of the vacancies to the active layer is well suppressed. As a result, a variation in the peak wavelength of photoluminescence of the active layer in the internal region of the laser resonator can be suppressed, and also deterioration of crystallinity of the active layer in the internal region of the laser resonator can be suppressed. Furthermore, since the peak wavelength of photoluminescence of the active layer in the region(s) in the vicinity of the end face(s) of the laser resonator is shorter than that in the internal region of the laser resonator, a window region where no laser light is absorbed is achieved in the active layer in the region(s) in the vicinity of the end face(s) of the laser resonator. Thereby, the occurrence of a COD in the active layer in the region in the vicinity of the end face of the laser resonator can be suppressed. Thus, it is possible to obtain a COD-free semiconductor laser element having superior long-term reliability for the high-power operation.

In one embodiment, the semiconductor layer interface containing oxygen atoms is present below a regrowth interface. Thus, it becomes possible to control the oxygen atom concentration at the semiconductor layer interface containing oxygen atoms.

In the case where the semiconductor layer interface containing oxygen atoms is flush with the regrowth interface, it is difficult to control the oxygen atom concentration at the semiconductor layer interface containing oxygen atoms because a native oxide film will be formed at the regrowth interface.

In contrast, according to this embodiment, being present below the regrowth interface, the semiconductor layer interface containing oxygen atoms is not affected by a native oxide film. For that reason, the oxygen atom concentration at the semiconductor layer interface containing oxygen atoms is well controllable. Thus, COD-free semiconductor laser elements superior in long-term reliability for high-output operation are obtainable in a high yield.

In one embodiment, the semiconductor layer interface has an oxygen atom concentration that is higher in the internal region of the laser resonator than in the region in the vicinity of the end face of the laser resonator.

The above arrangement enables vacancies, or holes, formed in the region in the vicinity of the end face of the laser resonator to be diffused to the active layer without being inhibited. This ensures that the peak wavelength of photoluminescence of the active layer in the region in the vicinity of the end face of the laser resonator is made shorter than that in the internal region of the laser resonator.

In one embodiment, the oxygen atom concentration at the semiconductor layer interface in the internal region of the laser resonator is in a range of $1 \times 10^{17}$ atoms/cm$^3$–$1 \times 10^{19}$ atoms/cm$^3$, inclusive.

This oxygen atom concentration range is effective in suppressing diffusion of vacancies inside the laser resonator to the active layer, and diffusion of oxygen atoms toward the substrate side. As a result, a variation in the peak wavelength of photoluminescence of the active layer in the internal region of the laser resonator is suppressed, and deterioration of crystallinity of the active layer in the internal region of the laser resonator is also suppressed.

In one embodiment, the regrowth interface in the internal region of the laser resonator has an oxygen concentration lower than that of the semiconductor layer interface containing oxygen atoms in the internal region of the laser resonator.

Therefore, reduction of carriers in the vicinity of the regrowth interface due to contamination with oxygen atoms can be suppressed, and hence increase in the resistance at the time of high-output operation can be suppressed.

In one embodiment, the semiconductor layer interface containing oxygen atoms is sandwiched between a semiconductor layer containing Al atoms and a semiconductor layer containing no Al atoms, and the semiconductor layer containing Al atoms is located below the semiconductor layer containing no Al atoms.

This arrangement prevents the oxygen atoms present at the semiconductor layer interface containing oxygen atoms from diffusing toward the direction of the substrate. This is because oxygen atoms are hard to diffuse in the semiconductor layer containing Al atoms. As a result, contamination of the active layer with oxygen atoms that are to become nonluminous recombination centers is prevented, thus making it possible to prevent deterioration of crystallinity of the active layer.

In one embodiment, the semiconductor substrate is of first-conductive-type and the active layer has a multiquantum well structure. At least a first-conductive-type cladding layer, the active layer, a second-conductive-type lower cladding layer, and a second-conductive-type upper cladding layer having a ridge stripe extending in a lengthwise direction of the laser resonator are provided on or above the first-conductive-type semiconductor substrate. The semiconductor layer interface containing oxygen atoms is formed on the second-conductive-type upper cladding layer.

With this construction, in the internal region of the laser resonator, the semiconductor layer interface containing oxygen atoms, where crystal defects are to be deposited, is formed at a position remote from the active layer. As a result, it is possible to reduce an adverse effect on the active layer of growth of defects, originated from the crystal defects, produced during high-output operation.

In one embodiment, the second-conductive-type upper cladding layer is a semiconductor layer containing Al atoms, a semiconductor layer containing no Al atoms is provided on the second-conductive-type upper cladding layer, and the semiconductor layer interface containing oxygen atoms is sandwiched between the second-conductive-type upper cladding layer and the semiconductor layer containing no Al atoms.

With this construction, diffusion of oxygen atoms present at the semiconductor layer interface containing oxygen atoms toward the substrate is suppressed. Therefore, it becomes possible to inhibit contamination of the second-conductive-type upper cladding layer, which has a ridge-shaped stripe serving as a current path, with oxygen atoms. Thus, an increase in the resistance at the time of high-output operation can be suppressed.

The semiconductor layer containing Al atoms may be made of AlGaAs or AlGaInP.

The semiconductor layer containing no Al atoms may be made of GaAs or GaInP.

The semiconductor substrate may be made of GaAs, and the semiconductor layers to be laid on the semiconductor substrate may be made of materials of AlGaAs series.

According to another aspect of the present invention, there is provided a process for producing a semiconductor laser element, comprising:

epitaxially growing semiconductor layers on or above a first-conductive-type semiconductor substrate of a wafer, said semiconductor layers including at least a first-conductive-type cladding layer, an active layer having a multiquantum well structure, a second-conductive-type lower cladding layer, and a second-conductive-type upper cladding layer;

forming a semiconductor layer interface containing oxygen atoms on the second-conductive-type upper cladding layer in an internal region of a laser resonator of the wafer having the epitaxially grown semiconductor layers; and making a peak wavelength of photoluminescence of the active layer of the wafer in a region (regions) in the vicinity of an end face (end faces) of the laser resonator shorter than that of the active layer in the internal region of the laser resonator.

The process of the present invention realizes both the suppression of diffusion of vacancies i.e. holes to the active layer in the internal region of the laser resonator, and the promotion of diffusion of vacancies to the active layer in the region(s) in the vicinity of the end face(s) of the laser resonator. Thus, this process achieves COD-free semiconductor laser elements having superior long-term reliability for the high-power operation with good yields.

In one embodiment, the step of forming a semiconductor layer interface containing oxygen atoms on the second-conductive-type upper cladding layer in an internal region of a laser resonator of the wafer having the epitaxially grown semiconductor layers comprises:

forming a damaged layer at a surface of the wafer in the internal region of the laser resonator;

forming an oxide film on or above the surface of the wafer in the internal region of the laser resonator; and annealing the wafer to diffuse oxygen atoms below the oxide film.

With this construction, the semiconductor layer interface containing oxygen atoms can be formed only in the internal region of the laser resonator.

In one embodiment, the process further comprises, after the step of annealing the wafer, removing the damaged layer and the oxide layer from the wafer.

In this embodiment, the oxygen atom concentration at the regrowth interface in the internal region of the laser resonator can be made lower than that of the semiconductor layer interface containing oxygen atoms by the above removing step.

In one embodiment, the step of making a peak wavelength of photoluminescence of the active layer of the wafer in a region in the vicinity of an end face of the laser resonator shorter than that of the active layer in the internal region of the laser resonator comprises:

forming a dielectric film in the region in the vicinity of the end face of the laser resonator of the wafer; and annealing the wafer to produce vacancies below the dielectric film and diffuse the vacancies into the active layer.

In the production process of this embodiment, Ga atoms, etc. in an epitaxially grown layer under the dielectric film are absorbed into the dielectric film, and vacancies are produced in the epitaxially grown layer of the wafer, thus making it possible to promote diffusion of the voids.

According to a further aspect of the present invention, there is provided a process for producing a semiconductor laser element comprising:

epitaxially growing semiconductor layers on or above a first-conductive-type semiconductor substrate of a wafer, said semiconductor layers including at least a first-conductive-type cladding layer, an active layer having a multiquantum well structure, a second-conductive-type lower cladding layer, and a second-conductive-type upper cladding layer;

forming a damaged layer at a surface of the wafer having the semiconductor layers epitaxially grown, in an internal region of the laser resonator;

forming an oxide film on or above the surface of the wafer in the internal region of the laser resonator as well as in a region in the vicinity of an end face of the laser resonator; and annealing the wafer to diffuse oxygen atoms below the oxide film and to make a peak wavelength of photoluminescence of the active layer of the wafer in the region in the vicinity of the end face of the laser resonator shorter than that of the active layer in the internal region of the laser resonator.

This production process realizes both the suppression of diffusion of vacancies i.e. holes to the active layer in the internal region of the laser resonator, and the promotion of diffusion of vacancies to the active layer in the region(s) in the vicinity of the end face(s) of the laser resonator, with simplified steps. Thus, this process achieves COD-free semiconductor laser elements having superior long-term reliability for the high-power operation with good yields.

In one embodiment, the process further comprises, after annealing the wafer, removing the damaged layer and the oxide layer from the wafer.

With this construction, it becomes possible to make the oxygen atom concentration at the regrowth interface in the internal region of the laser resonator lower than that at the semiconductor layer interface containing oxygen atoms in the internal region of the laser resonator.

In one embodiment, the step of epitaxially growing semiconductor layers comprises forming a protective layer made of a semiconductor layer containing no Al atoms on the second-conductive-type upper cladding layer, and the protective layer defines a surface of the wafer after the epitaxial growth.

In this embodiment, oxygen atoms can easily be diffused from the wafer surface. The reason thereof is that, in the protective layer made of a semiconductor layer containing no Al atoms, the rate of diffusion of oxygen atoms is very high. As a result, the oxygen concentration of the semiconductor layer interface in the internal region of the laser resonator can be made high.

In the step of forming a damaged layer at a surface of the wafer in the internal region of the laser resonator, ion irradiation using cluster ions may be conducted. This treatment increases adhesion of the oxide film to the underlying layer in the internal region of the laser resonator. As a result, it becomes possible to promote diffusion of oxygen atoms from this oxide film.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiments of this invention will hereinafter be described in detail.

(First Embodiment)

Figure 1:
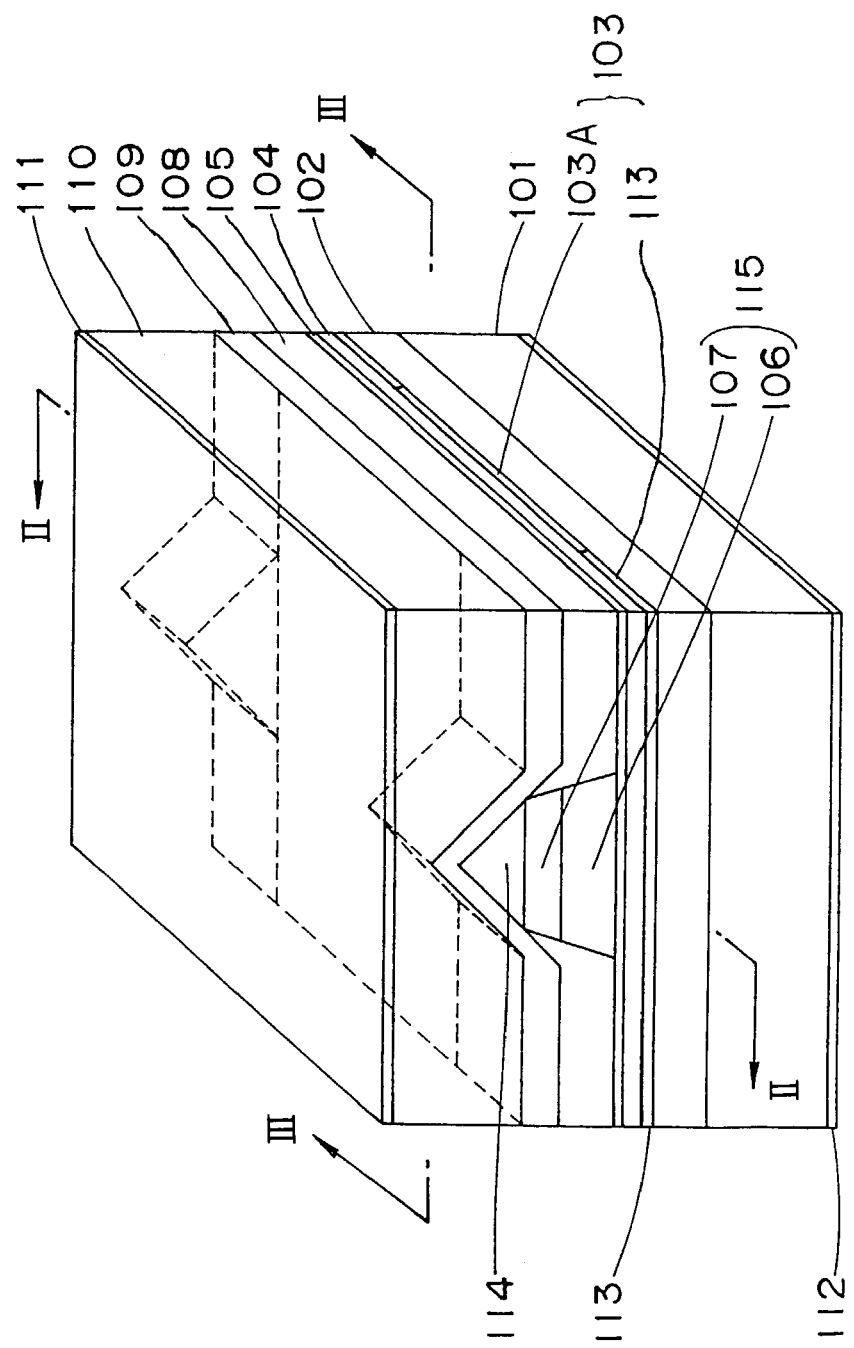
FIG. 1 is a perspective view showing the structure of a semiconductor laser element of a first embodiment of this invention.
Figure 2:
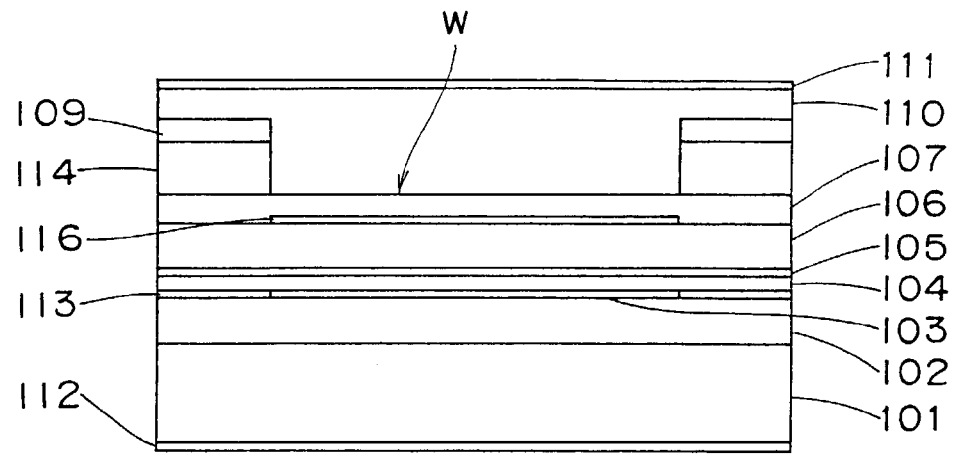
FIG. 2 is a cross sectional view taken along line II—II of FIG. 1, showing a waveguide.
Figure 3:
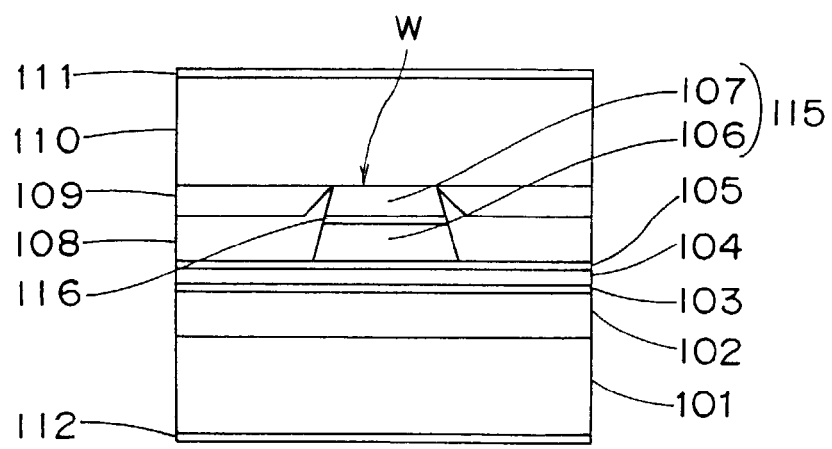
FIG. 3 is a cross sectional view taken along line III—III of FIG. 1 in the direction of layer thickness.

FIG. 1 is a perspective view showing the structure of a semiconductor laser element of a first embodiment of the invention. FIG. 1 shows a light-emitting end face of this embodiment. FIG. 2 is a cross sectional view taken along line II—II of FIG. 1, showing a waveguide. FIG. 3 is a cross section taken on line III—III of FIG. 1 in the direction of layer thickness.

As shown in FIGS. 1 to 3, a semiconductor laser element of this embodiment includes an n-type GaAs substrate 101, an n-type $Al_xGa_yAs$ ($0 \leq x \leq 1$ and $0 \leq y \leq 1$) first cladding layer 102 on the substrate 101, and an active layer (MQW active layer) 103, on the cladding layer 102, wherein a multiquantum well structure formed by alternately laying barrier layers and well layers is sandwiched between light-guiding layers.

This embodiment also includes a p-type $Al_xGa_yAs$ second cladding layer 104 on the active layer 103, a p-type GaAs etching stopper layer 105 on this cladding layer 104, and a p-type $Al_xGa_yAs$ third cladding layer 106, on the etching stopper layer 105, constructed of a ridge stripe extending in the lengthwise direction of a resonator.

The semiconductor laser element of this embodiment also includes a p-type GaAs protective layer 107 on the third cladding layer 106, and an n-type $Al_xGa_yAs$ current block layer 108 formed on the etching stopper layer 105 on both sides of the p-type $Al_xGa_yAs$ third cladding layer 106 as if the cladding layer 106 is embedded therein.

The semiconductor laser element of this embodiment also includes a p-type GaAs planarizing layer 109 on the current block layer 108, a p-type GaAs contact layer 110 on the planarizing layer 109 and the protective layer 107, a p-side electrode 111 on the contact layer 110, and an n-side electrode 112 formed on the underside of the substrate 101.

The active layer 103 includes window regions 113 defining regions in the vicinity of end faces of the laser resonator, and a region 103A defining an internal region of the laser resonator. The peak wavelength of photoluminescence is shorter in the window regions 113 than in the region 103A that forms the internal region.

The semiconductor laser element of this embodiment includes a current non-injection region 114 which is formed on the p-type GaAs protective layer 107 and which is made of part of the n-type $Al_xGa_yAs$ current block layer 108. In this embodiment, a stripe-shaped ridge (also referred to as "ridge stripe") 115 made of the p-type $Al_xGa_yAs$ third cladding layer 106 and the p-type GaAs protective layer 107 is also provided. This embodiment has an interface region containing oxygen atoms (a semiconductor layer interface containing oxygen atoms) 116.

PRODUCTION PROCESS

Next, with reference to FIG. 4A through FIG. 4H, the structure of the semiconductor laser element of the first embodiment will be described, while explaining a process for producing this semiconductor laser element.

Figure 4A:
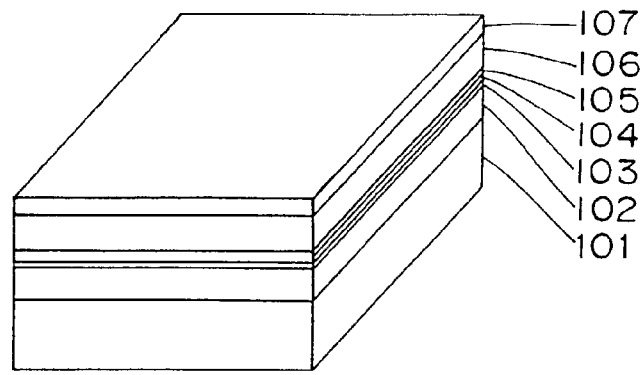
FIG. 4A through FIG. 4H are perspective views showing production process steps for the semiconductor laser element of the first embodiment.

First, as shown in FIG. 4A, the n-type $Al_xGa_yAs$ first cladding layer 102, the MQW active layer 103, the p-type $Al_xGa_yAs$ second cladding layer 104, the p-type GaAs etching stopper layer 105, the p-type $Al_xGa_yAs$ third cladding layer 106, and the p-type GaAs protective layer 107 are grown in this order on the n-type GaAs substrate 101 by a metal organic chemical vapor deposition (MOCVD) method.

After that, a resist mask 117 that is a protective film is formed on a surface of the p-type GaAs protective layer 107 only in regions Z in the vicinity of the end faces of the laser resonator X. The resist mask 117 is formed in stripes having a width of 40 μm in a direction perpendicular to the stripe-shaped ridges 115 by photolithography. The pitch of the stripes of the resist mask 117 is set to 800 μm, which is the same as the length of the laser resonator.

The resist mask 117 as the protective film is formed on the surface of the p-type GaAs protective layer 107 in the regions Z in the vicinity of the end faces of the laser resonator X so that the regions Z do not sustain damages in an ion irradiation step.

Figure 4B:
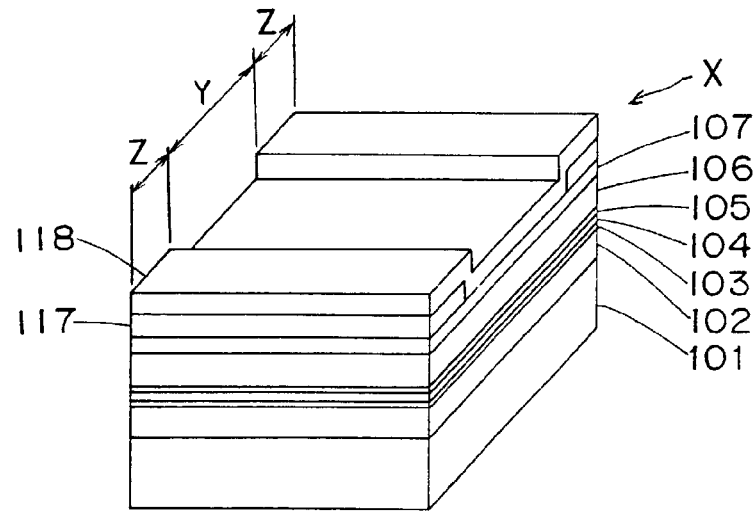

Subsequently, the ion irradiation using Ar ions is performed against the surface of the p-type GaAs protective layer 107 in the internal region Y of the laser resonator X. Thereby, a damaged layer (not shown) is formed on the surface of the p-type GaAs protective layer 107 in the internal region Y of the laser resonator X. Then, an oxide film 118 of $Si_xO_y$ (x≧1, y≧1) is formed on the surfaces of the protective resist mask 117 and the p-type GaAs protective layer 107 (FIG. 4B).

Figure 4C:
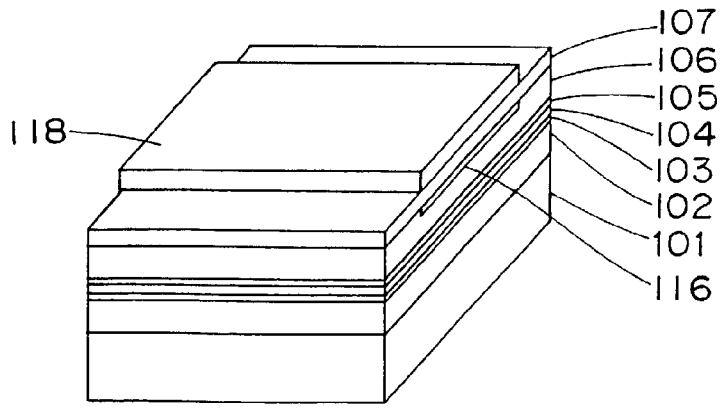

Next, as shown in FIG. 4C, the protective resist mask 117 and the oxide film 118 in the regions Z in the vicinity of the end faces of the laser resonator X are removed, and annealing follows. This annealing process diffuses oxygen atoms from the remaining oxide film 118 of $Si_xO_y$ toward the substrate 101 in the internal region Y of the laser resonator X. Thereby, an interface region 116 containing oxygen atoms is formed at the interface of the p-type $Al_xGa_yAs$ third cladding layer 106 and the p-type GaAs protective layer 107. In this embodiment, the oxygen concentration at the interface region 116 containing oxygen atoms in the internal region Y of the laser resonator X is set to $2.5 \times 10^{18}$ atoms/$cm^3$.

Figure 4D:
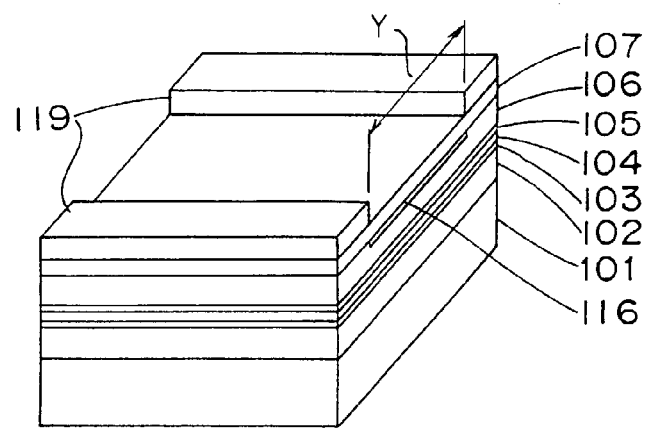

Next, as shown in FIG. 4D, the oxide film 118 and damaged layer in the internal region Y of the laser resonator X are removed. Thereafter, a dielectric film 119 of $Si_xO_y$ (x≧1, y≧1) is formed in stripes by a plasma CVD method on the surface of the p-type GaAs protective layer 107 in the regions Z in the vicinity of the end faces of the laser resonator X, the stripes having a width of 40 μm and extending in a direction perpendicular to the ridge stripe 115. The pitch of the stripes of the $Si_xO_y$ film 119 is set to 800 μm, which is the same as the length of the laser resonator.

Then, second annealing is conducted by a rapid thermal anneal (RTA) method. By this annealing, the peak wavelength of photoluminescence of the MQW active layer under the $Si_xO_y$ film 119, namely, the window regions 113 is set shorter than the peak wavelength of photoluminescence of the MQW active layer in the internal region Y of the laser resonator X, namely of the active region 103A. The annealing conditions at this time are: a temperature of 900° C., a temperature rising rate of 100° C./sec, and a retention time of 60 sec.

Figure 4E:
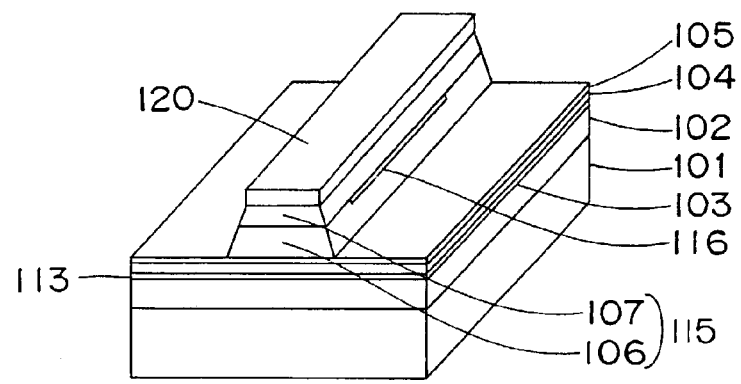

Then, as shown in FIG. 4E, the stripes of the $Si_xO_y$ dielectric film 119 formed in the regions Z in the vicinity of the end faces of the laser resonator X are removed. Using a known photolithography technique, a stripe-shaped resist mask 120 extending in the [0 1 1] or [0 -1 -1] direction is formed on the p-type GaAs protective layer 107. Thereafter, using a known etching technique, etching is performed until the p-type GaAs etching stopper layer 105 is reached, whereby the p-type GaAs protective layer 107 and the p-type $GaAl_xGa_yAs$ third cladding layer 106 are formed into approximately 3 μm-wide stripe-shaped ridges, namely ridge stripes 115 extending in the [0 1 1] or [0 -1 -1] direction (only one ridge 115 for one laser element is shown).

Figure 4F:
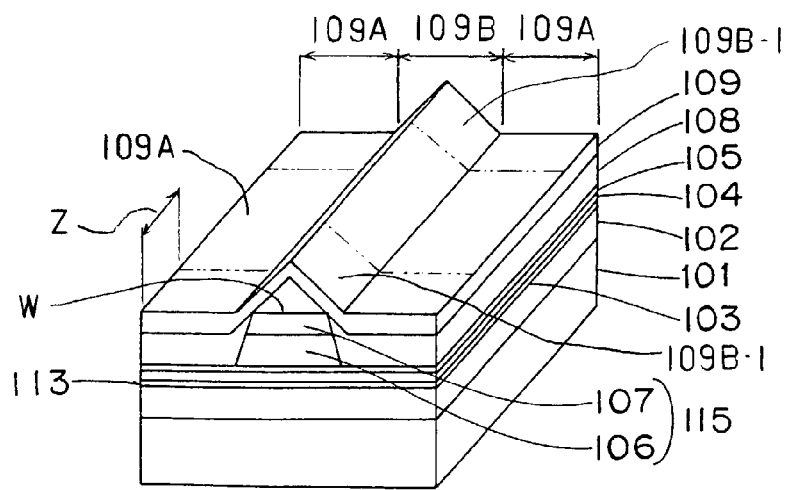

After that, as shown in FIG. 4F, the stripe-shaped resist mask 120 formed on the p-type GaAs protective layer 107 is removed, and the n-type $Al_xGa_yAs$ current block layer 108 and the p-type GaAs planarizing layer 109 are deposited by MOCVD so as to bury the ridge stripes 115 therein.

Figure 4G:
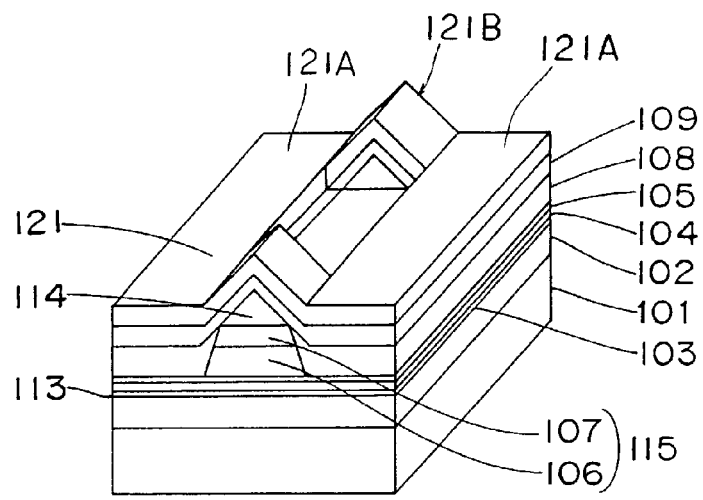

Next, as shown in FIG. 4G, using a known photolithography technique, a resist mask 121 is formed. The resist mask 121 consists of portions 121A formed on planar portions 109A (see FIG. 4F) of the p-type GaAs planarizing layer 109 located between the ridge stripes 115, and 40 μm-wide portions 121B which are located on portions 109B-1 of the p-type GaAs planarizing layer 109 on the ridge stripes 115 in the regions Z in the vicinity of the end surfaces of the laser resonator X.

Then, again as shown in FIG. 4G, using the resist mask 121, the n-type AlGaAs current block layer 108 and the p-type GaAs planarizing layer 109 are selectively removed at openings of the resist mask 121.

Figure 4H:
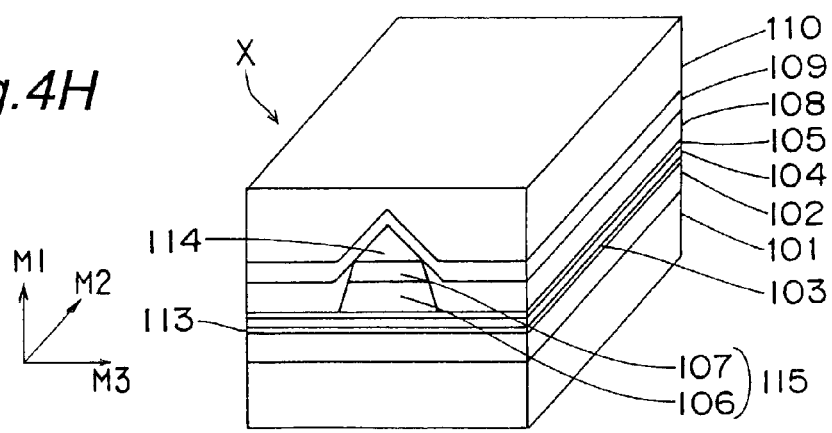

Thereafter, as shown in FIG. 4H, the resist mask 121 formed on the p-type GaAs planarizing layer 109 is removed and then the p-type GaAs contact layer 110 is formed by MOCVD. Furthermore, as shown in FIG. 1, a p-electrode 111 is formed on the top of the resulting wafer, while an n-electrode 112 is formed at the bottom of the wafer.

After that, scribe lines are drawn in the M3 direction at an approximate center in the lengthwise direction (M2) of each region Z (40 μm-wide) in the vicinity of the end faces of the laser resonator X to divide the wafer into bars.

Lastly, both light-emitting end faces of each bar are coated with a reflection film and further divided into chips. In this way, there are provided semiconductor laser elements having in the end portions of the resonator×800 μm long the window regions 113 and current non-injection regions 114, of which the lengths in the M2 direction are about 20 μm.

Figure 5:
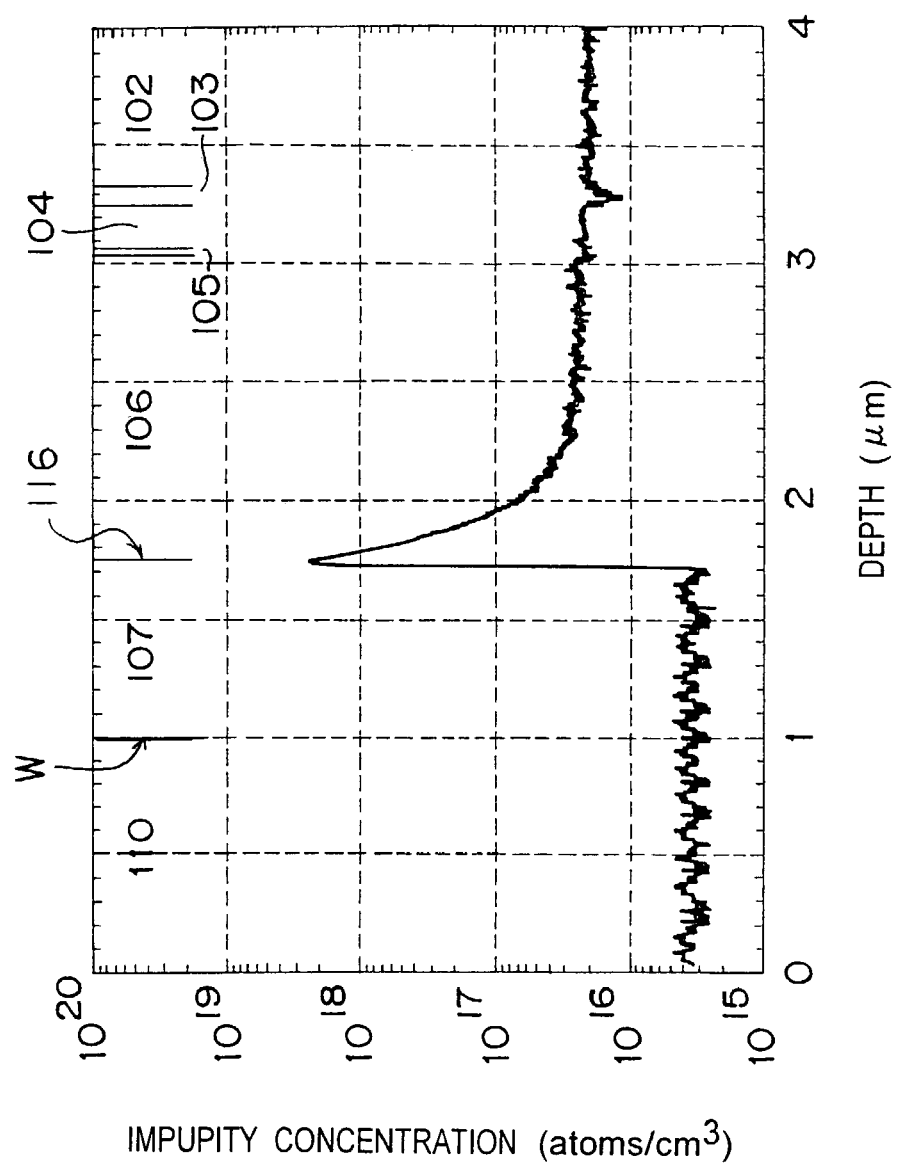
FIG. 5 shows distribution of oxygen atoms in the depth direction in an internal region of a laser resonator in a ridge stripe of the semiconductor laser element of the first embodiment.
Figure 6:
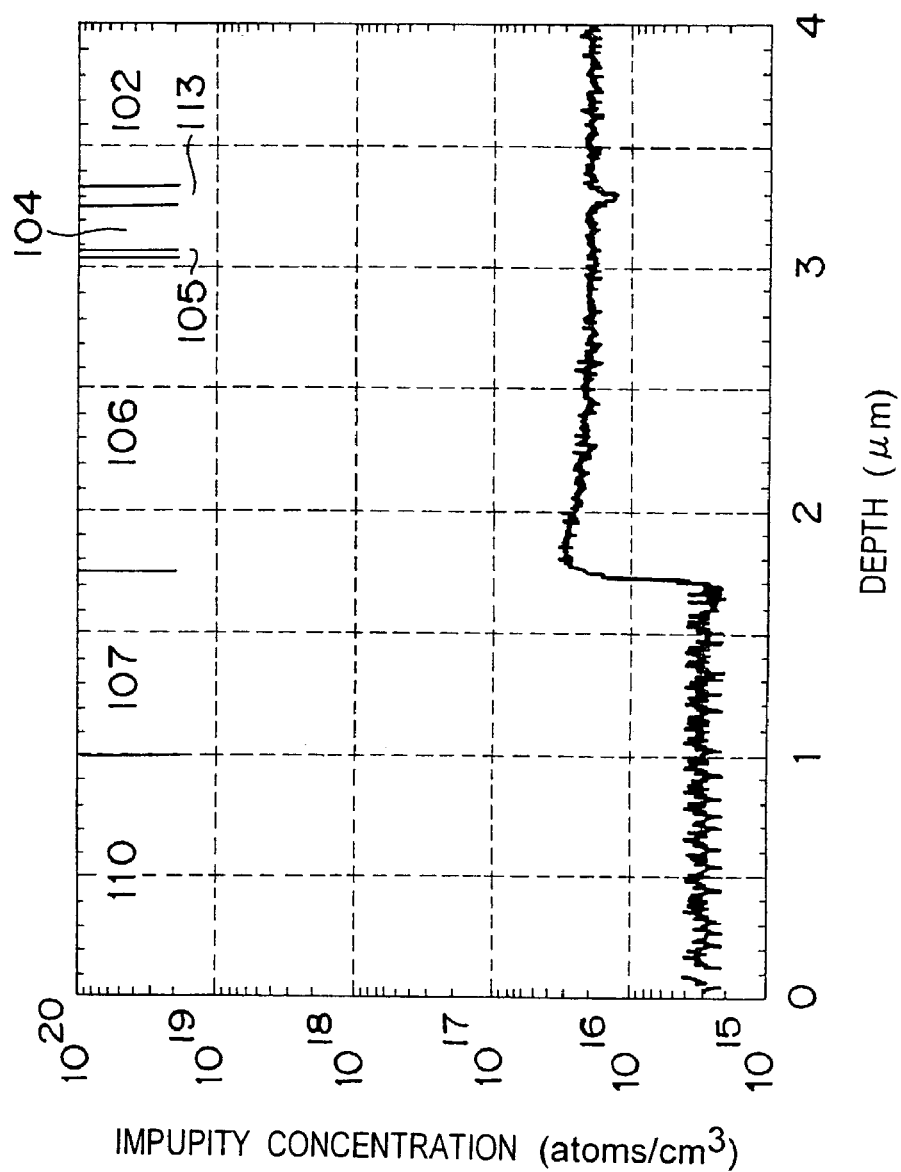
FIG. 6 shows distribution of oxygen atoms in the depth direction in a region in the vicinity of an end face of the laser resonator in the ridge stripe of the semiconductor laser element of the first embodiment.

Next, FIG. 5 shows the distribution of oxygen atoms in the depth direction of the internal region Y of the laser resonator X at the ridge stripe 115 of the thus obtained semiconductor laser element of the embodiment. FIG. 6 shows the distribution of oxygen atoms in the depth direction of the regions Z in the vicinity of the end faces of the laser resonator X at the ridge stripe 115 of the semiconductor laser element of the embodiment. In FIGS. 5 and 6, numerals 110, 107, 106, 105, 104, 103 and 102 present at the upper part of the graphs correspond to the numerals in FIG. 1, and vertical lines drawn between the numerals show positions of interfaces between the layers designated by the numerals.

The distributions of oxygen atoms in the depth direction shown in FIGS. 5 and 6 are results of measurement by secondary ion mass spectroscopy (SIMS). In FIGS. 5 and 6, the axis of ordinates represents the impurity concentration (atoms/cm$^3$), while the axis of abscissas represents the depth (μm) from the p-type GaAs contact layer 110 side. The detection lower limit for measurement of the oxygen concentration is $3 \times 10^{15}$ atoms/cm$^3$ for the p-type GaAs protective layer 107 and the p-type GaAs contact layer 110, and is $2 \times 10^{16}$ atoms/cm$^3$ for the respective layers from the first cladding layer 102 to the third cladding layer 106.

As shown in FIG. 5, an interface containing oxygen atoms at $2.5 \times 10^{18}$ atoms/cm$^3$ is formed between the p-type GaAs protective layer 107 and the p-type AlGaAs third cladding layer 106 above the active layer 103 of the internal region Y of the laser resonator X. On the other hand, as shown in FIG. 6, an interface containing oxygen atoms is not formed in the regions Z in the vicinity of the end faces of the laser resonator X.

Furthermore, as is apparent from FIG. 5, in the internal region Y of the laser resonator X, oxygen atoms have not been detected at a regrowth interface W between the p-type GaAs contact layer 110 and the p-type GaAs protective layer 107, and the interface layer 116 containing oxygen atoms is formed below the regrowth interface W.

As described above, in the semiconductor laser element of the embodiment, the semiconductor layer interface 116 containing oxygen atoms is formed not at the regrowth interface W between the p-type GaAs contact layer 110 and the p-type GaAs protective layer 107 but below the regrowth interface W. It is apparent that this has allowed the oxygen atom concentration at the semiconductor layer interface to be controlled as desired, without being affected by the spontaneous formation of a native oxide film.

In the production process of the semiconductor laser element of this embodiment, a damaged layer (not shown) is formed on a wafer top surface (i.e., a top surface of the p-type GaAs protective layer 107) in the internal region Y of the laser resonator X and then the oxide film 118 is formed on the wafer top surface (i.e., a top surface of the p-type protective layer 107) in the internal region Y of the laser resonator X. After that, the wafer is annealed so that oxygen atoms are diffused below the oxide film 118. Thus, as is apparent, the interface region 116 containing oxygen atoms is obtainable only in the internal region Y of the laser resonator X located below the regrowth interface W.

Furthermore, in the production process of the semiconductor laser element of this embodiment, after diffusing oxygen atoms toward below the oxide film 118, the damaged layer and oxide film 118 in the internal region Y of the laser resonator X are removed. Thereby, the formation of a native or spontaneous oxide film can be suppressed on the surface of the wafer, which is to be the regrowth interface W in the internal region Y of the laser resonator X. As a result, the oxygen atom concentration at the regrowth interface in the internal region Y of the laser resonator X can be made lower than that of the semiconductor layer interface 116 containing oxygen atoms.

In the production process of the semiconductor laser element of this embodiment, after epitaxially growing the semiconductor layer containing no Al atoms (i.e., the p-type GaAs protective layer 107) on a wafer surface, the damaged layer is formed on the wafer surface in the internal region Y of the laser resonator X. Thereafter, the oxide film 118 is formed on the wafer surface in the internal region Y of the laser resonator X. The wafer thus obtained is annealed so as to diffuse oxygen atoms below the oxide film 118. Thereby, the semiconductor layer interface 116 containing oxygen atoms is formed between the p-type AlGaAs third cladding layer 106 containing Al atoms and the p-type GaAs protective layer 107 containing no Al atoms.

A portion of the wafer immediately after the first epitaxial growth by MOCVD in the above-described production process of the embodiment was subjected to the measurement of the wavelength of the MQW active layer 103 by a photoluminescence (PL) method. As a result, the wavelength was 775 nm.

Next, a portion of the wafer after annealed by the RTA (rapid thermal annealing) method was subjected to measurement of the peak wavelength by the photoluminescence (PL) method. More specifically, the peak wavelength of the window regions 113 of the MQW active layer 103 forming the region in the vicinity of the end face of the laser resonator X, and that of the active region 103A of the MQW active layer 103 forming the internal region Y of the laser resonator X were individually measured. As a result, the window regions had a peak wavelength of 745 nm, while the active region 103A had a peak wavelength of 775 nm.

The emission spectrum of the window region 113 shifted toward the short wavelength side by 30 nm, compared with that of the active region 103A. The peak wavelength of PL (photoluminescence) of the active region 103A after annealing by the RTA (rapid thermal annealing) method was the same as that immediately after the first epitaxial growth.

For comparison, a wafer not having the interface region containing oxygen atoms in an internal region of the laser resonator was also measured as to a peak wavelength of an MQW active layer in a region in the vicinity of an end face of the laser resonator (a window region), and a peak wavelength of the MQW active layer in the internal region of the laser resonator (an active region). As a result, the window region had a peak wavelength of 745 nm, while the active region had a peak wavelength of 770 nm. That is, the emission spectrum of the window region shifted toward the short wavelength side by 25 nm, compared with that of the active region. The peak wavelength of PL (photoluminescence) of the active region after annealing by the RTA method shifted toward the short wavelength side by 5 nm, compared with that immediately after the first epitaxial growth.

Furthermore, in the semiconductor laser element of this embodiment, the interface region 116 containing oxygen atoms is formed at least above the MQW active layer 103 forming the internal region Y of the laser resonator X. Thereby, crystal defects present in the vicinity of the interface region 116 containing oxygen atoms tend to bond to oxygen atoms present in the interface region 116 so as to be in a more stable state. Accordingly, crystal defects are liable to be deposited in the interface region 116 containing oxygen atoms.

Therefore, in the internal region Y of the laser resonator X, the atomic vacancies or holes, one of crystal defects, that are produced above and in the vicinity of the interface region 116 containing oxygen atoms are captured at the interface region 116. Thereby, it is possible to suppress diffusion of the vacancies to the MQW active layer 103. As a result, a variation in the peak wavelength of photoluminescence of the MQW active layer 103 in the internal region Y of the laser resonator X can be suppressed.

In the production process of the semiconductor laser element of this embodiment, the second annealing by the RTA method is performed, whereby Ga and As atoms are absorbed into the $Si_xO_y$ ($x \geq 1$, $y \geq 1$) dielectric film 119 from the surface of the p-type GaAs protective layer 107 under the $Si_xO_y$ film 119. Due to this phenomenon, holes i.e. atomic vacancies are produced in the inside of the p-type GaAs protective layer 107, the vacancies being diffused in the direction of the n-type GaAs substrate 101, thus making it possible to disorder the MQW active layer 103. Thereby, the bandgap energy of the MQW active layer in the regions Z in the vicinity of the end faces of the laser resonator X (the window regions) 113 increases. Consequently, the window regions 113 are achieved which have a bandgap width effectively larger than that of the active region 103A, of the MQW active layer, forming the internal region Y of the laser resonator X.

Most of the emission spectrum of the active layer 103 is obtained according to the photoluminescence (PL) method by making excited light having a larger energy than the bandgap energy (bandgap width) of the active layer enter the active layer 103 so that electrons in the active layer 103 are excited into the conduction band and the electrons are recombined with holes in the valence band. Thus, the peak energy of emission spectrum of the photoluminescence (PL) is almost equal to that of the bandgap energy (bandgap width) of the active layer 103. Accordingly, the peak wavelength of photoluminescence (PL) is almost inverse proportion to the bandgap energy (bandgap width) of the active layer 103.

Furthermore, in this embodiment, the distributions of oxygen atoms in the depth direction in the internal region Y of the laser resonator X and in the regions Z in the vicinity of the end faces of the laser resonator X are as shown in FIGS. 5 and 6. That is, the oxygen atom concentration at the interface between the p-type AlGaAs third cladding layer 106 and the p-type GaAs protective layer 107 is higher in the internal region Y of the laser resonator X than in the regions Z in the vicinity of the end faces of the laser resonator X. With this construction, since the semiconductor layer interface 116 containing oxygen atoms, which is to be a region for capturing atomic vacancies, is not present in the regions Z in the vicinity of the end faces of the laser resonator X, it becomes possible to diffuse the vacancies formed in the regions Z in the vicinity of the end faces of the laser resonator X to the active layer 103 without any blocking. Thereby, the peak wavelength of photoluminescence of the active layer 113 in the regions Z in the vicinity of the end faces of the laser resonator X can fully be made shorter than that of the active layer 103A in the internal region Y of the laser resonator X.

As described above, in the semiconductor laser element made by the production process of this embodiment, the peak wavelength of photoluminescence of the active layer 113 in the regions Z in the vicinity of the end faces of the laser resonator X is shorter than that of the active layer 103A in the internal region Y of the laser resonator X, and also a variation in the peak wavelength of photoluminescence of the active layer 103A in the internal region Y of the laser resonator X is suppressed.

Next, characteristics of the semiconductor laser element of the embodiment obtained by the above production process were measured. For comparison, characteristics of a semiconductor laser element obtained by a similar process that does not include a step of forming an interface region containing oxygen atoms in an internal region of a laser resonator were also measured.

As a result, the semiconductor laser element of this embodiment had the oscillation wavelength ($\lambda$) of 785 nm at CW 120 mW, while the semiconductor laser element of the comparative example had the oscillation wavelength ($\lambda$) of 780 nm at CW 120 mW. The resistance (R) at CW 120 mW was 3.5 $\Omega$ in both of the semiconductor laser element of the embodiment and the semiconductor laser element of the comparative example. In this way, in this embodiment, the prevention of the oscillation wavelength from being made shorter and the prevention of the increase in the resistance at the time of high-output operation were realized.

Reliability test was conducted on these semiconductor laser elements at 70° C. and 120 mW. While the average lifetime of the semiconductor laser elements of the comparative example was about 2000 hours, the average lifetime of the semiconductor laser elements of the embodiment was about 3000 hours. Thus, the average lifetime was also improved in the embodiment.

This improvement in the lifetime is attributable to the fact that the reduction of carriers due to the inclusion of oxygen atoms was able to be suppressed in the vicinity of the regrowth interface W between the p-type GaAs contact layer 110 and the p-type GaAs protective layer 107 in the internal region Y of the laser resonator X. The reason thereof is that the oxygen atom concentration in the regrowth interface W is lower than that of the interface region 116 containing oxygen atoms in the internal region Y of the laser resonator X.

In the semiconductor laser element of this embodiment, the p-type AlGaAs third cladding layer 106 is a semiconductor layer containing Al atoms, and the p-type GaAs protective layer 107 containing no Al atoms is provided on the p-type AlGaAs third cladding layer 106. The interface region 116 containing oxygen atoms is sandwiched between the p-type AlGaAs third cladding layer 106 containing Al atoms, where diffusion of oxygen atoms hardly occurs, and the GaAs protective layer 107 containing no oxygen atoms. With this construction, diffusion of oxygen atoms present in the interface region 116 in the direction toward the substrate 101 is suppressed, and which in turn suppresses inclusion of oxygen atoms in the p-type AlGaAs second cladding layer 104 on which the ridge stripe 115, which is to become a current path, is provided.

Furthermore, in the semiconductor laser element of this embodiment, the interface region 116 containing oxygen atoms is sandwiched between the p-type AlGaAs third cladding layer 106 that is a semiconductor layer containing Al atoms, and the p-type GaAs protective layer 107 that is a semiconductor layer containing no Al atoms. Also, the AlGaAs third cladding layer 106 where diffusion of oxygen atoms hardly occurs is located below the p-type GaAs protective layer 107 containing no Al atoms. With this construction, diffusion oxygen atoms present in the interface region 116 to the MQW active layer 103 can be suppressed, thus making it possible to prevent crystal deterioration of the active layer 103.

In the semiconductor laser element of this embodiment, the interface region 116 containing oxygen atoms is formed on the p-type AlGaAs third cladding layer 106, which is a semiconductor layer containing Al atoms, in the internal region Y of the laser resonator X. That is, in the internal region Y of the laser resonator X, the interface region 116 containing oxygen atoms, where vacancies, or holes that are crystal defects are precipitated, is formed at a position remote from the MQW active layer 103. As a result, an adverse effect on the MQW active layer 103 of an increase of defects originated from crystal defects and occurring during a high-output operation can be reduced.

Although in this embodiment the oxygen atom concentration at the interface region 116 in the internal region Y of the laser resonator X was set to $2.5 \times 10^{18}$ atoms/cm³, the oxygen atom concentration at that region may be changed in the range between $1 \times 10^{17}$ atoms/cm³ and $1 \times 10^{19}$ atoms/cm³. If the concentration is within the above range, it is possible to suppress diffusion of atomic vacancies to the active layer 103A in the internal region of the laser resonator, and also possible to suppress diffusion of oxygen atoms in the direction toward the substrate. As a result, a variation in the peak wavelength of photoluminescence of the active layer 103A that defines the internal region Y of the laser resonator X is suppressed and deterioration of crystallinity of the active layer 103A is also suppressed.

In the production process of the first embodiment, an $Si_xO_y$ film ($x \geq 1$ and $y \geq 1$) was used as the oxide film 118. However, any one of native oxide, $Al_xO_y$, and $Si_xO_yN_z$ ($x \geq 1$, $y \geq 1$ and $z \geq 1$) may be also employed. These materials allow oxygen atoms to be diffused below the oxide film 118.

In the first embodiment, a $Si_xO_y$ ($x \geq 1$ and $y \geq 1$) film was used as the dielectric film 119. However, alternatively, $Si_xN_y$ and $Si_xO_yN_z$ ($x \geq 1$, $y \geq 1$ and $z \geq 1$) may be used. These materials allow vacancies to be produced in the p-type GaAs protective layer 107 under the dielectric film 119. Therefore, the active layer 113 in the regions Z in the vicinity of the end faces of the laser resonator X can be made window regions having a bandgap width effectively wider than that of the active layer (the active region) 103A in the internal region of the laser resonator.

The first embodiment has been described in connection with the $Al_xGa_yAs$ semiconductor lasers. Similar effects can be obtained when the present invention is applied to $Al_x$-$Ga_yIn_zP$ ($0 \leq x \leq 1$, $0 \leq y \leq 1$ and $0 \leq z \leq 1$) semiconductor lasers.

(Second Embodiment)

Next, with reference to FIG. 7A through FIG. 7G in this order, a process for producing a semiconductor laser element of a second embodiment of the invention will be described.

Figure 7A:
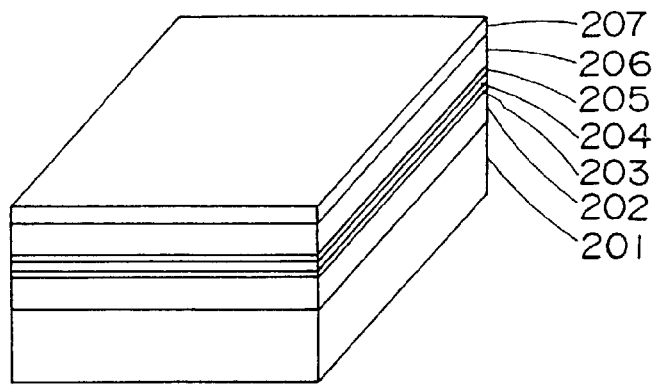
FIG. 7A through FIG. 7G are perspective views showing production process steps for a semiconductor laser element of a second embodiment.

First, as shown in FIG. 7A, an n-type $Al_xGa_yAs$ first cladding layer 202, an MQW active layer 203, a p-type $Al_xGa_yAs$ second cladding layer 204, a p-type GaAs etching stopper layer 205, a p-type $Al_xGa_yAs$ third cladding layer 206, and a p-type GaAs protective layer 207 are sequentially grown epitaxially on an n-type GaAs substrate 201 by the MOCVD method.

As to the wavelength of the MQW active layer 203, a portion of the wafer immediately after the epitaxial growth was measured by the PL method. The result of this measurement was 775 nm.

Figure 7B:
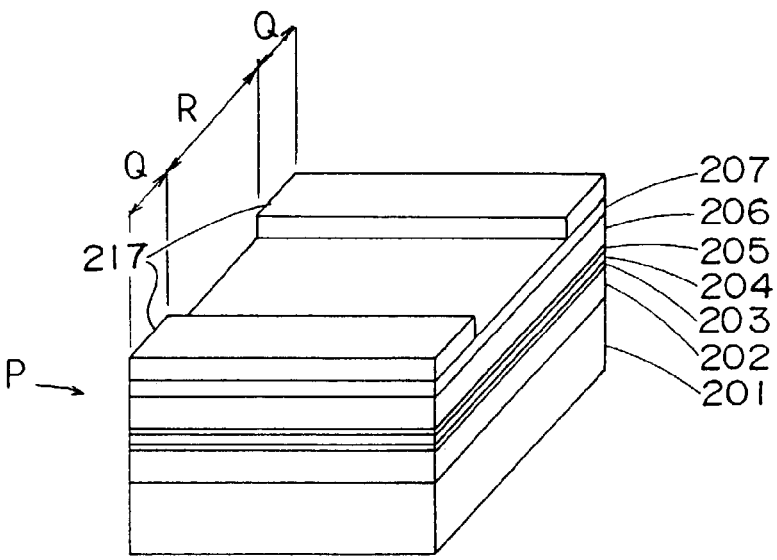

After that, as shown in FIG. 7B, a dielectric film 217 of $Si_xO_y$ ($x \geq 1$, $y \geq 1$) is formed in stripes having a width of 40 µm and running in a direction perpendicular to a ridge stripe described below, by a plasma CVD method and photolithography. The pitch of the stripes was set to 800 µm, which was the same as the length of a laser resonator.

Figure 7C:
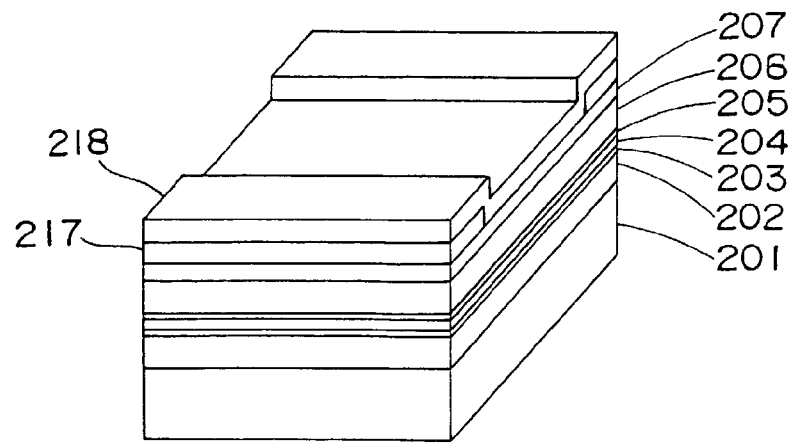

Next, referring again to FIG. 7B, ion irradiation using $Si_xO_y$ ($x \geq 1$, $y \geq 1$) cluster ions is performed upon surfaces of the p-type GaAs protective layer 207 in the internal region R of the laser resonator P, and the $Si_xO_y$ dielectric film 217 in regions Z in the vicinity of end faces of the laser resonator P to thereby form a damaged layer (not shown) on the top surface of the p-type GaAs protective layer 207 in the internal region R of the laser resonator P. Thereafter, an oxide film 218 of $Si_xO_y$ ($x \geq 2$, $y \geq 1$) 218 is formed on the surfaces of the p-type GaAs protective layer 207 in the internal region R of the laser resonator P and the $Si_xO_y$ dielectric film 217 in the regions Q in the vicinity of the end faces of the laser resonator P as shown in FIG. 7C. The $Si_xO_y$ dielectric film 217 formed in the regions Q in the vicinity of the end faces of the laser resonator P also functions as a protective film to avoid a damage due to the ion irradiation.

Figure 7D:
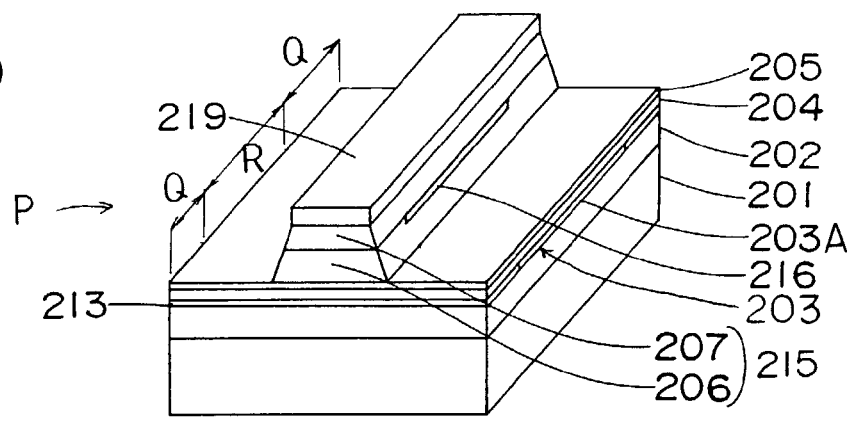

Thereafter, annealing of the wafer by the RTA method is performed to diffuse oxygen atoms from the $Si_xO_y$ oxide film 218 in the internal region R of the laser resonator Q toward the substrate 201 so that an interface region 216 containing oxygen atoms is formed between the p-type $Al_xGa_yAs$ third cladding layer 206 and the p-type GaAs protective layer 207, as shown in FIG. 7D. Also, the peak wavelength of window regions 213 of the MQW active layer below the $Si_xO_y$ dielectric film 217 in the regions Q in the vicinity of the end faces of the laser resonator P is made smaller than the peak wavelength of an MQW active layer region (an active region) 203A in the internal region R of the laser resonator P. The annealing conditions at this time are: a temperature of 900° C., a temperature rising rate of 100° C./sec, and a retention time of 60 sec.

A portion of the wafer after annealing by the RTA (rapid thermal annealing) method was subjected to the measurement of the peak wavelength by the photoluminescence (PL) method. That is, the peak wavelength of the MQW active layer 213 of the regions Q in the vicinity of the end faces of the laser resonator P (i.e., the window regions), and that of the MQW active layer 203A of the internal region R of the laser resonator P (i.e., the active region) were individually measured. As a result, the window regions 213 had a peak wavelength of 745 nm, while the active region 203A had a peak wavelength of 775 nm. That is, the emission spectrum from the window region 213 shifted toward the short wavelength side by 30 nm, compared with that from the active region 203A. The peak wavelength of PL (photoluminescence) of the active region 203A was the same before and after the annealing.

As described above, in the second embodiment, the number of steps for forming the protective film and the number of annealing steps were reduced, as compared with the production process of the first embodiment, to simplify the production process.

This second embodiment of the present invention also provides a semiconductor laser element wherein the peak wavelength of photoluminescence of the active layer 213 of the regions Q in the vicinity of the end faces of the laser resonator P is shorter than that of the active layer 203A of the internal region R of the laser resonator P and a variation in the peak wavelength of photoluminescence of the active layer 203A in the internal region R of the laser resonator P is suppressed.

Next, as shown in FIG. 7D, the $Si_xO_y$ dielectric film 217 on the p-type GaAs protective layer 207, the $Si_xO_y$ oxide film 218, and the damaged layer at the wafer surface in the internal region R of the laser resonator P are removed.

Then, using a known photolithography technique, a stripe-shaped resist mask 219 extending in the [0 1 1] direction or the [0 −1 −1] direction is formed on the p-type GaAs protective layer 207. Furthermore, using a known etching technique, etching is performed until the p-type GaAs etching stopper layer 205 is reached, whereby the p-type GaAs protective layer 207 and the p-type $Al_xGa_yAs$ third cladding layer 206 are formed into approximately 3 $\mu$m-wide stripe-shaped ridges 215 extending in the [0 1 1] or [0 −1 −1] direction.

Figure 7E:
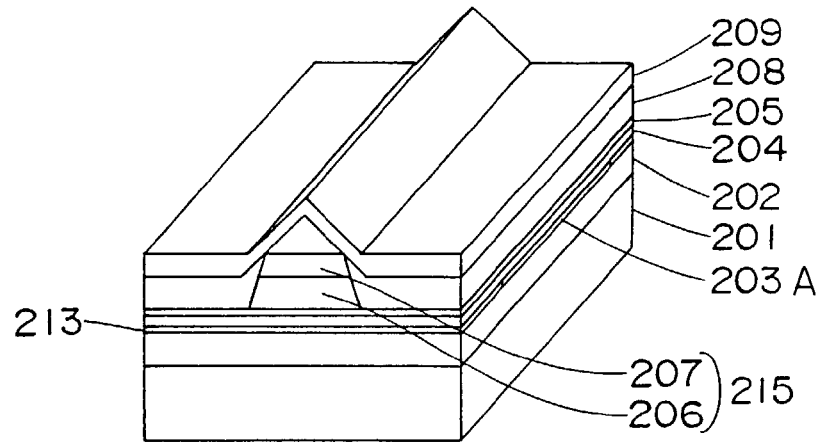

After that, as shown in FIG. 7E, the stripe-shaped resist mask 219 formed on the p-type GaAs protective layer 207 is removed. Then, the ridges 215 (only one is shown), which each consist of the p-type GaAs protective layer 207 and the p-type AlGaAs cladding layer 206, are buried in an n-type $Al_xGa_yAs$ current block layer 208 and a p-type GaAs planarizing layer 209 which are deposited by MOCVD.

Figure 7F:
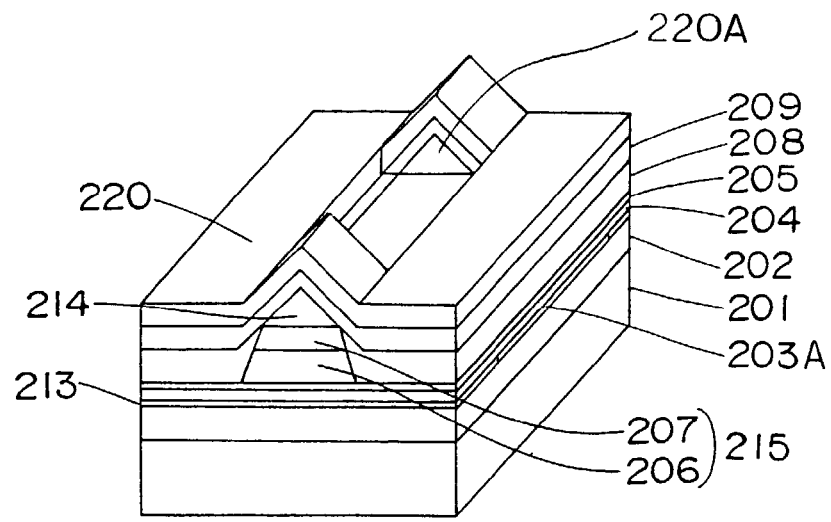

Then, as shown in FIG. 7F, using a known photolithography technique, a resist mask 220 is formed on the p-type GaAs planarizing layer 209, which mask consists of portions located in regions between the ridges 215 and 40 $\mu$m-wide stripe-shaped portions located on the ridges 215 in the regions Q in the vicinity of the end faces of the laser resonator P.

Then, as shown in FIG. 7F, using a known etching technique, the n-type AlGaAs current block layer 208 and the p-type GaAs planarizing layer 209 are selectively removed at portions that are opposed to openings 220A of the resist 220 mask.

Figure 7G:
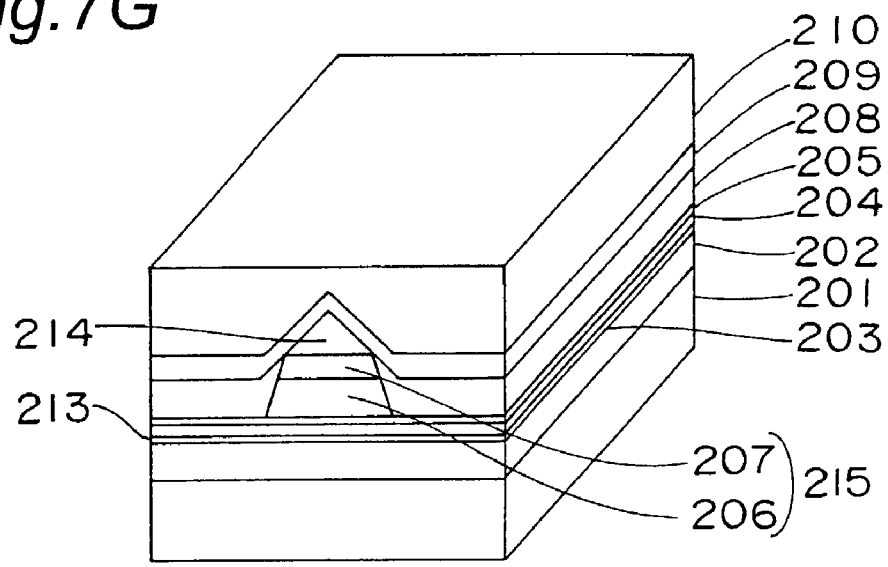

Thereafter, as shown in FIG. 7G, the resist mask 220 formed on the p-type GaAs planarizing layer 209 is removed and then a p-type GaAs contact layer 210 is formed by MOCVD. Furthermore, a p-electrode (not shown) is formed on the top of the resulting wafer, while an n-electrode (not shown) is formed at the bottom of the wafer.

After that, scribe lines are drawn at an approximate center in the lengthwise direction of each region Q (40 $\mu$m-wide) in the vicinity of the end faces of the laser resonator P to divide the wafer into bars having the length of the resonator P.

Lastly, both light-emitting end faces of each bar are coated with a reflection film and further divided into chips. In this way, semiconductor laser elements having the about 20-$\mu$m window regions 213 and current non-injection regions 214 in the end portions of the resonator P 800 $\mu$m long are provided.

The distributions of oxygen atoms in the depth direction of the internal region R of the laser resonator P and of the regions Q in the vicinity of the end faces of the laser resonator P in the ridge stripe 215 of the semiconductor laser element obtained by the production process of the second embodiment, were determined by secondary ion mass spectroscopy (SIMS). As a result, as shown in FIG. 7D, in the internal region R of the laser resonator P, an semiconductor layer interface 216 containing oxygen atoms at $1 \times 10^{18}$ atoms/cm$^3$ was formed between the p-type GaAs protective layer 207 and the p-type AlGaAs third cladding layer 206. On the other hand, in the regions Q in the vicinity of the end faces of the laser resonator P, an interface region containing oxygen atoms was not formed. Furthermore, oxygen atoms were not detected at a regrowth interface between the p-type GaAs contact layer 210 and the p-type GaAs protective layer 207 in the internal region R of the laser resonator P, and the interface 216 of the semiconductor layer containing oxygen atoms was formed below the regrowth interface.

As described above, in the second embodiment, the semiconductor layer interface 216 containing oxygen atoms is able to be formed only in the internal region R of the laser resonator P and between the semiconductor layer 206 containing Al atoms and the semiconductor layer 207 containing no Al atoms.

The production process according to the second embodiment includes the steps of diffusing oxygen atoms below the oxide film 218 and making the peak wavelength of photoluminescence of the active layer 213 in the regions Q in the vicinity of the end faces of the laser resonator P shorter than that of the active layer 203A in the internal region R of the laser resonator P. Furthermore, the oxide film 218 formed in the internal and end regions R and Q of the laser resonator P and the damaged layer formed in the internal region R of the laser resonator P are removed, whereby a native oxide film is prevented from being formed on a wafer surface that is to become the regrowth interface in the internal region R of the laser resonator P.

As a result, the oxygen concentration at the regrowth interface in the internal region R of the laser resonator P can be made lower than that of the interface 216 containing oxygen atoms in the internal region R of the laser resonator P.

Furthermore, in the second embodiment, ion irradiation using cluster ions is performed upon the wafer surface (protective layer 207) in the internal region R of the laser resonator P to form a damaged layer, whereby adhesion of the oxide film 218 to the wafer surface in the internal region R of the laser resonator P is improved. Thus, performing only one annealing step is able to stimulate oxygen atoms to diffuse from the oxide film 218 in the internal region R of the laser resonator P.

Next, characteristics of the semiconductor laser element obtained by the production process according the second embodiment were measured. For comparison, characteristics of the semiconductor laser element fabricated by the production process according to the first embodiment were also measured at the same time.

As a result, both the semiconductor laser elements of the first and second embodiments had the oscillation wavelength ($\lambda$) of 785 nm at CW 120 mW. The operation current (Iop) at CW 120 mW of the semiconductor laser element of the second embodiment was 140 mA, while that of the semiconductor laser element of the first embodiment was 150 mA. That is, the production process for the semiconductor laser element of the second embodiment achieves both the suppression of shortening the oscillation wavelength and the reduction in the current at the time of high-output operation.

The suppression of shortening the oscillation wavelength is attributed to the reduced diffusion of vacancies toward the MQW active layer 203 in the internal region R of the laser resonator P. Further, the reduction in the operation current results from the suppression of diffusion of p-type conductive impurities such as Zn atoms toward the MQW active layer 203 due to the reduction of the number of annealing steps.

Although in the second embodiment the oxygen atom concentration in the interface region 216 in the internal region R of the laser resonator P was set to $1 \times 10^{18}$ atoms/cm$^3$, the oxygen atom concentration in that region may be changed in the range between $1 \times 10^{17}$ atoms/cm$^3$ and $1 \times 10^{19}$ atoms/cm$^3$. If the oxygen concentration is within the above range, it is possible to suppress diffusion of atomic vacancies to the active layer 203 in the internal region of the laser resonator P, and also possible to suppress diffusion of oxygen atoms in the direction toward the substrate. As a result, a variation in the peak wavelength of photoluminescence of the active layer 203 that defines the internal region R of the laser resonator P is suppressed and deterioration of crystallinity of that active layer is also suppressed.

In the second embodiment, an $Si_xO_y$ film ($x \geq 1$ and $y \geq 1$) was used as the oxide film 118. However, any one of native oxide, $Al_xO_y$, and $Si_xO_yN_z$ ($x \geq 1$, $y \geq 1$ and $z \geq 1$) may be also employed. These materials allow oxygen atoms to be diffused below the oxide film 218. Thus, similar effects as above can be obtained.

In the second embodiment, an $Si_xO_y$ ($x \geq 1$ and $y \geq 1$) film was used as the dielectric film 217, and if, alternatively, $Si_xN_y$ or $Si_xO_yN_z$ ($x \geq 1$, $y \geq 1$, $z \geq 1$) is used, it is also possible to produce vacancies in the p-type GaAs protective layer 207 under the dielectric film 217. Therefore, it is possible to form the active layer 213 in the regions Q in the vicinity of the end faces of the laser resonator P into window regions having a bandgap width effectively wider than that of the active layer (the active region) 203A in the internal region R of the laser resonator P.

In the second embodiment, ion irradiation using $Si_xO_y$ ($x \geq 1$, $y \geq 1$) cluster ions was conducted in the step of irradiating the p-type GaAs protective layer 207 in the internal region R of the laser resonator P. Similar effects can be obtained even in the case of irradiation using other kinds of cluster ions such as $Si_xN_y$.

The second embodiment has been described in connection with the $Al_xGa_yAs$ semiconductor lasers. Similar effects can be obtained even when the present invention is applied to $Al_xGa_yIn_zP$ ($0 \leq x \leq 1$, $0 \leq y \leq 1$ and $0 \leq z \leq 1$) semiconductor lasers.

(Third Embodiment)

Figure 8:
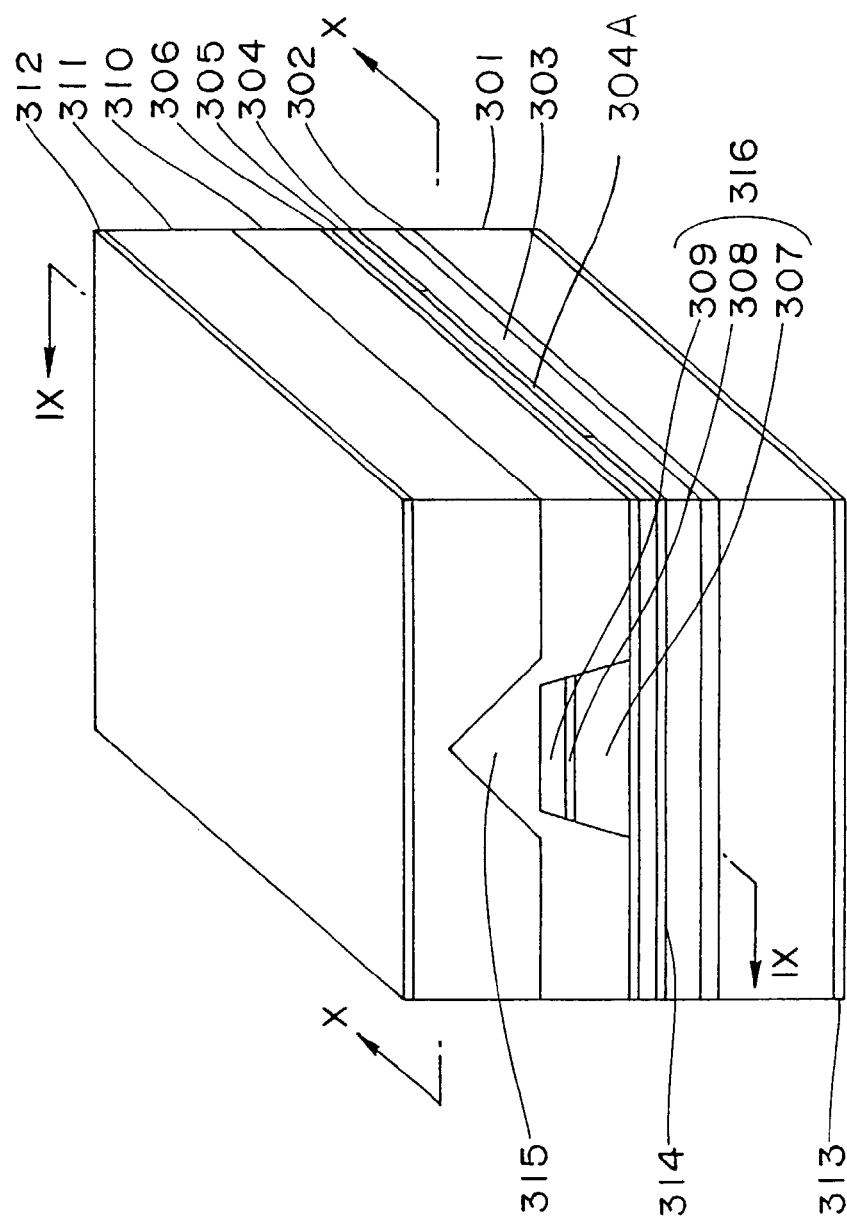
FIG. 8 is a perspective view of a semiconductor laser element of a third embodiment of this invention, showing an emission end face thereof.
Figure 9:
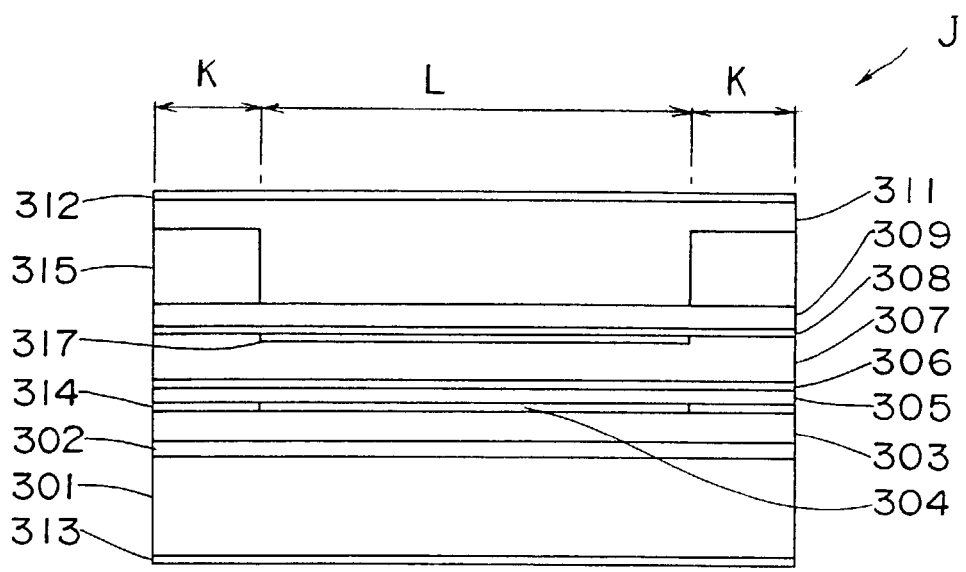
FIG. 9 is a cross sectional view of a waveguide taken along line IX—IX of FIG. 8.
Figure 10:
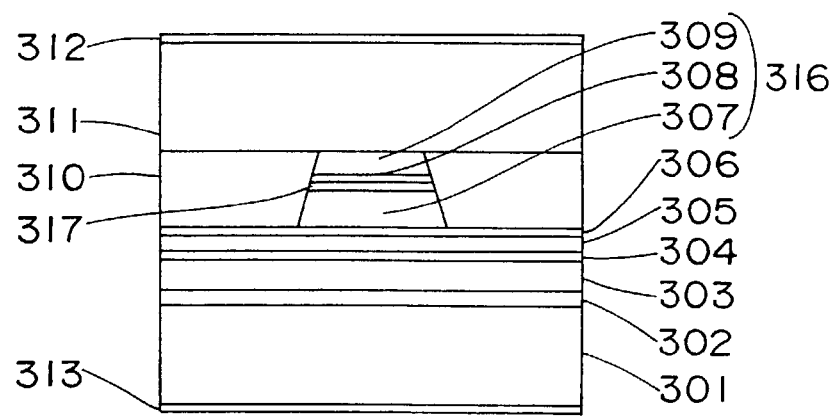
FIG. 10 is a cross sectional view taken along line X—X of FIG. 9 in the direction of layer thickness.

Next, with reference to FIG. 8 through FIG. 10, a semiconductor laser element of a third embodiment of the present invention will be described. FIG. 8 is a perspective view showing the structure of the third embodiment, inclusive of a light emitting end face. FIG. 9 shows a cross section taken along line IX—IX of FIG. 8, showing a waveguide. FIG. 10 shows a cross section taken along line X—X of FIG. 1 in the direction of layer thickness.

As shown in FIG. 8, the semiconductor laser element of the third embodiment includes an n-type GaAs substrate 301 that is inclined at an angle of 15° in the [0 1 1] or [0 −1 −1] direction, an n-type $Ga_yIn_zP$ ($0 \leq y \leq 1$ and $0 \leq z \leq 1$) buffer layer 302 on the substrate 301, and an n-type $Al_xGa_yIn_zP$ ($0 \leq x \leq 1$, $0 \leq y \leq 1$ and $0 \leq z \leq 1$) first cladding layer 303.

The semiconductor laser element of the third embodiment also includes an active layer (MQW active layer) 304 wherein a multiquantum well structure formed by alternately laying barrier layers and well layers is sandwiched between light-guiding layers, on the first cladding layer 303, a p-type $Al_xGa_yIn_zP$ second cladding layer 305 on the MQW active layer 304, and a p-type etching stopper layer 306 on the second cladding layer 305.

The semiconductor laser element of the third embodiment also includes a p-type $Al_xGa_yIn_zP$ third cladding layer 307 in the shape of a stripe extending in the direction of a resonator on the p-type etching stopper layer 306, a p-type $Ga_yIn_zP$ intermediate layer 308 on the third cladding layer 307, and a p-type GaAs protective layer 309 on the intermediate layer 308. The p-type $Al_xGa_yIn_zP$ third cladding layer 307, the p-type $Ga_yIn_zP$ intermediate layer 308, and the p-type GaAs protective layer 309 form a stripe-shaped ridge (ridge stripe) 316.

The semiconductor laser element of this embodiment also includes an n-type $Al_xIn_zP$ ($0 \leq x \leq 1$ and $0 \leq z \leq 1$) current block layer 310 formed in such a manner as to fill the gaps between the ridge stripes 316. The semiconductor laser element also includes a p-type GaAs contact layer 311 on the current block layer 310, a p-side electrode 312, and an n-side electrode 313.

As shown in FIG. 9, the MQW active layer 304 of the third embodiment consists of an MQW active layer 304A which forms an internal region L of a laser resonator J, and window regions 314 which forms regions K in the vicinity of end faces of the laser resonator J. The peak wavelength of photoluminescence of the window regions 314 is shorter than that of the MQW active layer 304A.

The semiconductor laser element of this third embodiment also includes current non-injection regions 315 formed by part of the n-type $Al_xGa_yIn_zP$ current block layer 310 on the p-type GaAs protective layer 309, and as shown in FIG. 10, an interface region 317 containing oxygen atoms (a semiconductor layer interface containing oxygen atoms).

(Production Process)

Next, with reference to FIG. 11A through FIG. 11G, the structure of the semiconductor laser element of the third embodiment will be described in more detail while explaining a production process for the semiconductor laser element.

Figure 11A:
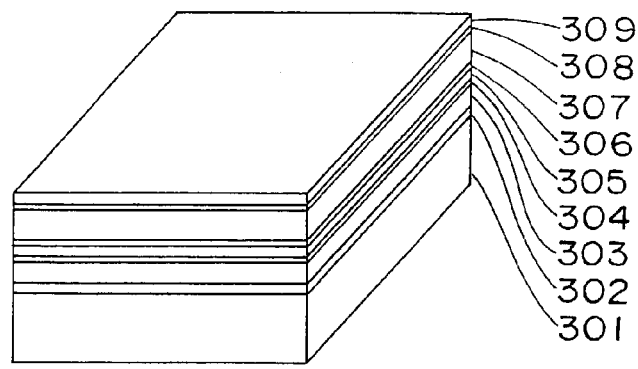
FIG. 11A through FIG. 11G are perspective views showing production process steps for the semiconductor laser element of the third embodiment.

First, as shown in FIG. 11A, on the n-type GaAs substrate 301 that is inclined at an angle of 15° in the [0 1 1] or [0−1−1] direction, the n-type $Ga_yIn_zP$ buffer layer 302, the n-type $Al_xGa_yIn_zP$ first cladding layer 303, the MQW active layer 304, the p-type $Al_xGa_yIn_zP$ second cladding layer 305, the p-type etching stopper layer 306, the p-type $Al_xGa_yIn_zP$ third cladding layer 307, the p-type $Ga_yIn_zP$ intermediate layer 308, and the p-type GaAs protective layer 309 are epitaxially grown in this order by molecular beam epitaxy (MBE).

As to the wavelength of the MQW active layer 304, a portion of the wafer immediately after the epitaxial growth was measured by the PL method. As a result, the wavelength of the MQW active layer was 640 nm.

Figure 11B:
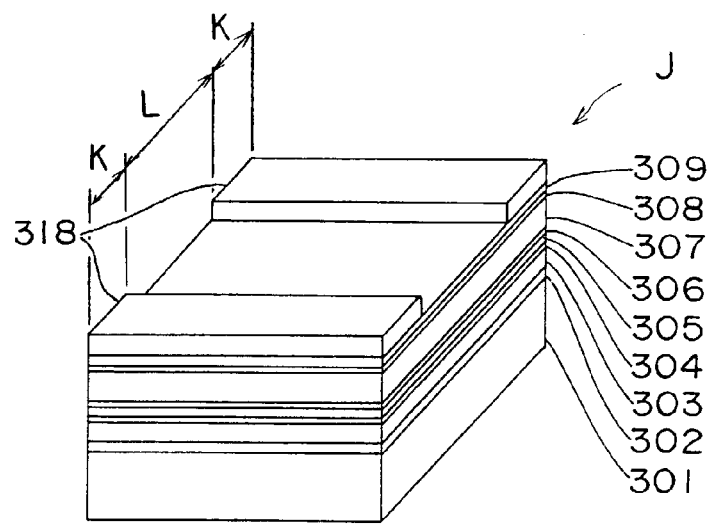

After that, as shown in FIG. 11B, on a surface of the p-type GaAs protective layer 309 in the regions K in the vicinity of end faces of the laser resonator J, an $Si_xN_y$ ($x \geq 1$ and $y \geq 1$) film 318 serving as a protective film is formed in 40 μm-wide stripes extending in a direction perpendicular to the ridge stripe 316, by plasma CVD and photolithography. The pitch of the stripes 316 was set to 800 μm, which is the same as the length of the laser resonator. The reason why the $Si_xN_y$ ($x \geq 1$ and $y \geq 1$) protective film 318 is formed on the surface of the p-type GaAs protective layer 309 in the regions K in the vicinity of the end faces of the laser resonator J is to prevent the surface from being damaged by ion irradiation.

Subsequently, ion irradiation using $Si_xN_y$ ($x \geq 1$ and $y \geq 1$) cluster ion is performed upon the surface of the p-type GaAs protective layer 309 in the internal region L of the laser resonator J to thereby form a damaged layer on the surface of the p-type GaAs protective layer 309 in the internal region L of the laser resonator J. Then, the $Si_xN_y$ protective film 318 is removed.

Figure 11C:
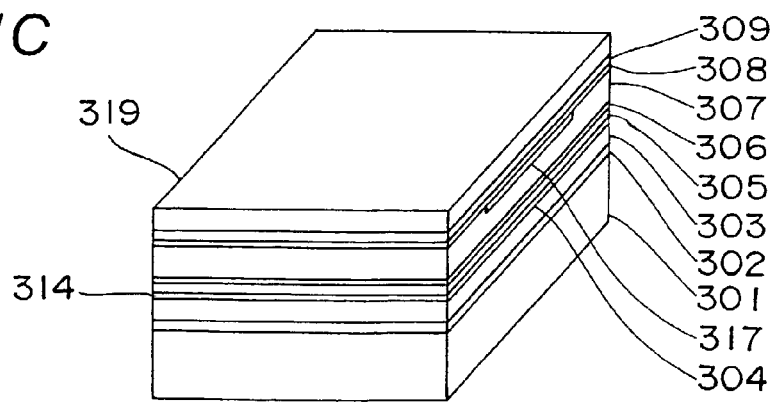

Then, as shown in FIG. 11C, a $Si_xO_y$ ($x \geq 1$ and $y \geq 1$) film 319, which is an oxide film and a dielectric film, is formed on the surface of the p-type GaAs protective layer 309. After that, annealing of the wafer is performed to diffuse oxygen atoms from the $Si_xO_y$ oxide film 319 in the internal region L of the laser resonator J toward the substrate so that the interface region 317 containing oxygen atoms is formed between the p-type $Al_xGa_yIn_zP$ third cladding layer 307 and the p-type $Ga_yIn_zP$ intermediate layer 308, as shown in FIG. 11C. Also, the peak wavelength of the MQW active layer regions (the window regions) 314 below the $Si_xO_y$ dielectric film 319 in the regions K in the vicinity of the end faces of the laser resonator L is made smaller than the peak wavelength of the MQW active layer region (the active region) 304A in the internal region L of the laser resonator J.

In a portion of the wafer after annealed by the RTA (rapid thermal annealing) method, the peak wavelength of the MQW active layer (the window regions) 314 in the regions K in the vicinity of the end faces of the laser resonator J, and that of the MQW active layer (the active region) 304A in the internal region L of the laser resonator J were individually measured by the PL (photoluminescence) method. As a result, the window regions 314 had a peak wavelength of 610 nm, while the active region 304A had a peak wavelength of 640 nm. That is, the emission spectrum from the window region 314 shifted toward the short wavelength side by 30 nm, compared with that from the active region 304A. The peak wavelength of PL of the active region 304A was the same before and after the annealing.

In the third embodiment, after forming the damaged layer in the internal region L of the laser resonator J, the $Si_xO_y$ dielectric film 319 was formed all over the wafer. In this case also, there is achieved a semiconductor laser element, wherein the peak wavelength of the photoluminescence of the active layer 314 in the regions K in the vicinity of the end faces of the laser resonator J is shorter than that of the active layer 304A in the internal region L of the laser resonator J, and also a variation in the peak wavelength of the photoluminescence of the active layer 304A in the internal region of the laser resonator J is suppressed.

A portion of the wafer after annealing by the RTA method was subjected to measurement of the distribution of oxygen atoms in the depth direction using secondary ion mass spectroscopy (SIMS). As a result, as shown in FIGS. 9 and 10, it was found that a semiconductor layer interface 317 containing $7 \times 10^{17}$ atoms/cm$^3$ had been formed between the p-type $Al_xGa_yIn_zP$ third cladding layer 307 and the p-type $Ga_yIn_zP$ intermediate layer 308. On the other hand, an interface region containing oxygen atoms was not formed in the regions K in the vicinity of the end faces of the laser resonator J.

Thus, it is apparent that the semiconductor layer interface 317 containing oxygen atoms is formed only in the internal region L of the laser resonator J between the p-type $Al_xGa_y-In_zP$ third cladding layer 307 (a semiconductor layer containing Al atoms) and the p-type $Ga_yIn_zP$ intermediate layer 308 (a semiconductor layer containing no Al atoms).

Figure 11D:
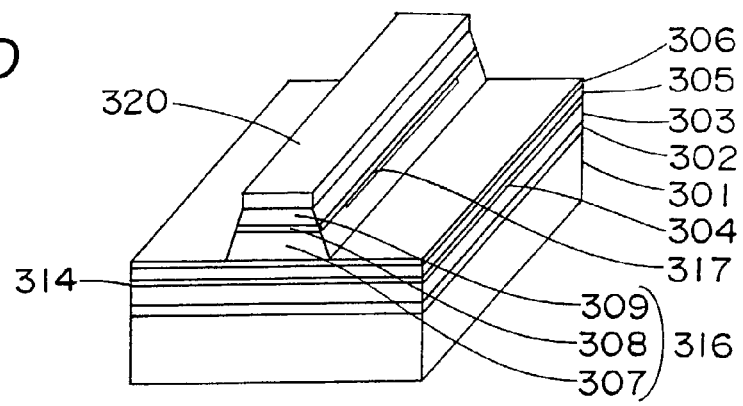

Next, the $Si_xO_y$ film 319 serving as the oxide film as well as the dielectric film, and the damaged layer formed in the internal region L of the laser resonator J were removed. Then, using a known photolithography technique, a resist mask 320 patterned into stripes extending in a [0 –1 1] or [0 1 –1] direction is formed on the p-type GaAs protective layer 309. Thereafter, as shown in FIG. 11D, using a known etching technique, etching is performed until the p-type GaAs etching stopper layer 306 is reached, whereby the p-type GaAs protective layer 309, the p-type $Ga_yIn_zP$ intermediate layer 308 and the p-type $Al_xGa_yIn_zP$ third cladding layer 307 are formed into approximately 3 μm-wide stripe-shaped ridges (only one is shown) 316 extending in the [0 –1 1] or [0 1 –1] direction.

Figure 11E:
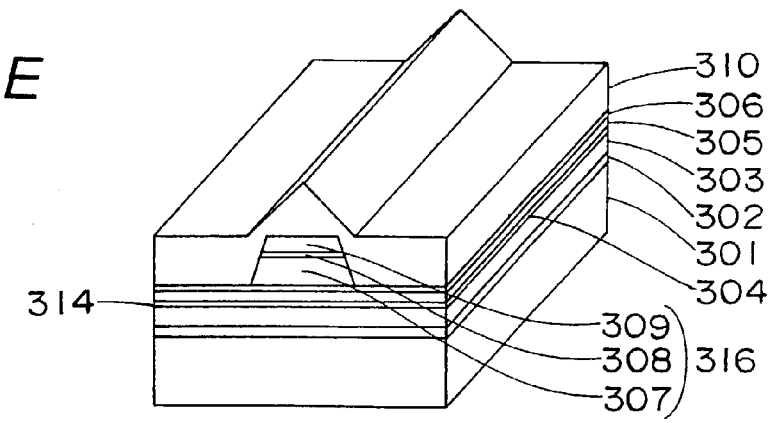

After that, as shown in FIG. 11E, the stripe-shaped resist mask 320 formed on the p-type GaAs protective layer 309 is removed, and the gaps between the ridges 316 are filled with the n-type $Al_xIn_zP$ current block layer 310 formed by the MBE method.

Next, using a known photolithography technique, a resist mask 321 is formed on the n-type $Al_xIn_zP$ current block layer 310, which mask consists of portions located in regions between the ridges 316 and 40 μm-wide stripe-shaped portions located on the ridges 316 in the regions K in the vicinity of the end faces of the laser resonator L. Then, as shown in FIG. 11F, using a known etching technique, the n-type $Al_xIn_zP$ current block layer 310 is selectively removed at openings (only one is shown) 321A of the resist mask 321.

Figure 11F:
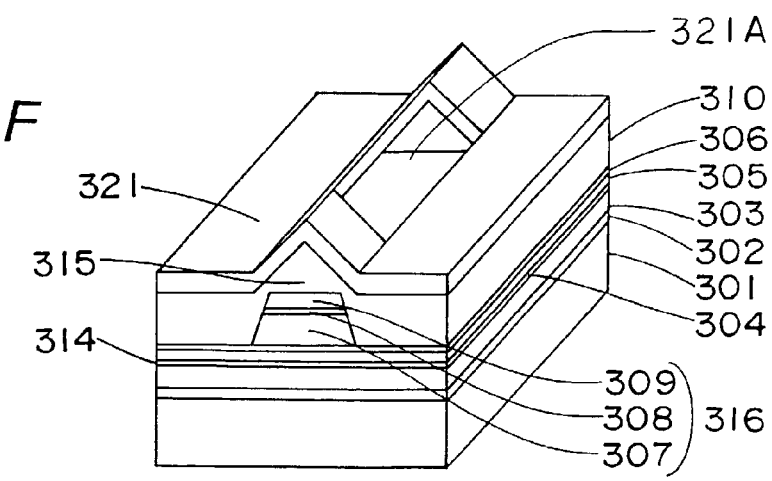
Figure 11G:
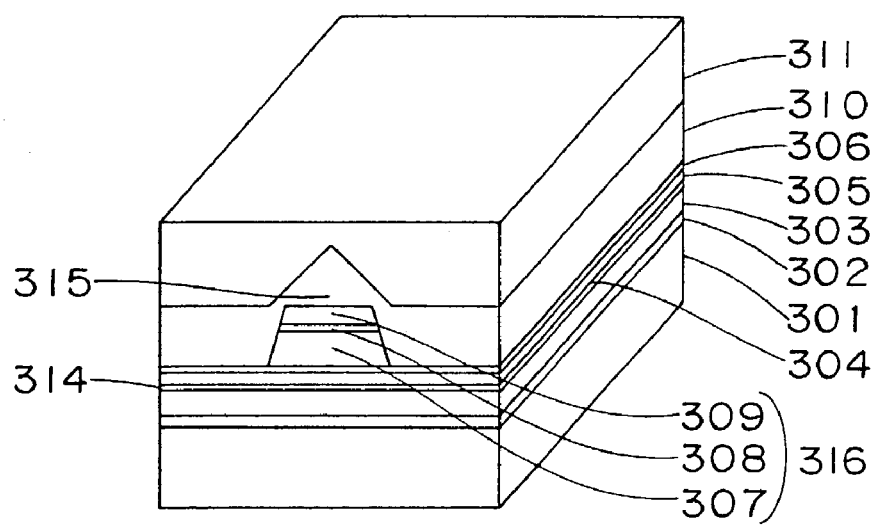
Figure 12:
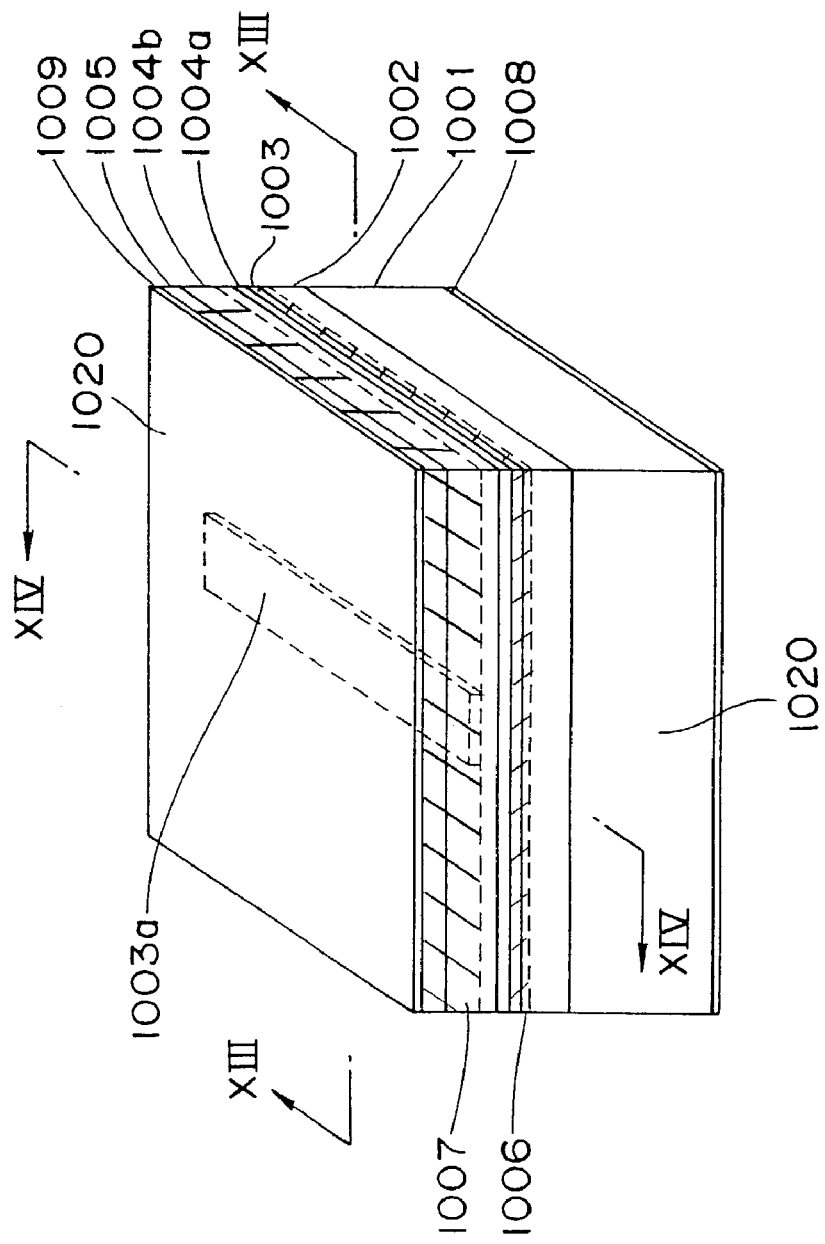
FIG. 12 is a perspective view of a prior art semiconductor laser element, showing a laser resonator end face 1020.
Figure 13:
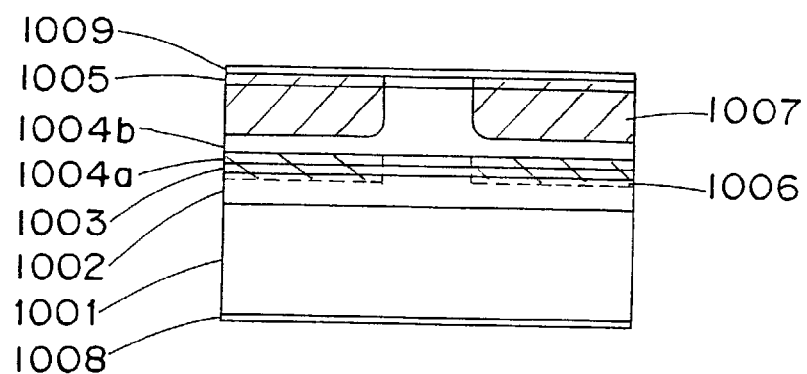
FIG. 13 is a cross sectional view taken along line VIII—VIII of FIG. 12 in the direction of layer thickness.
Figure 14:
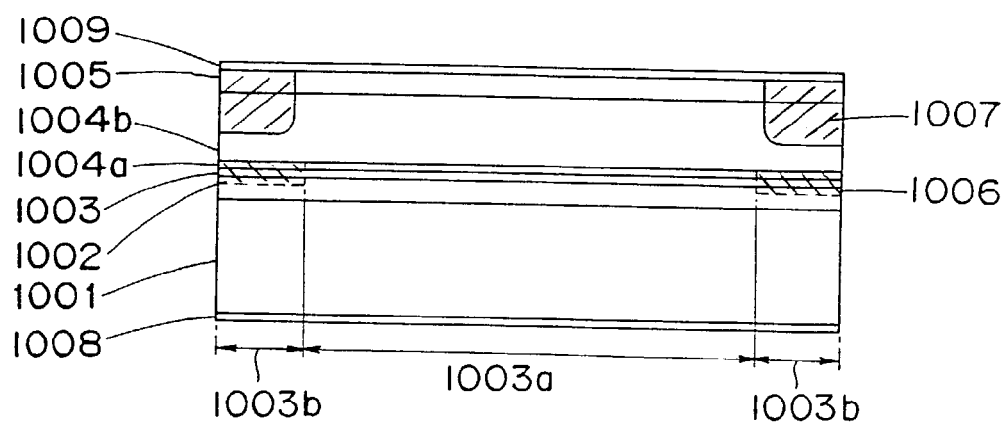
FIG. 14 is a cross sectional view taken along line XIV—XIV of FIG. 12, showing a waveguide.
Figure 15A:
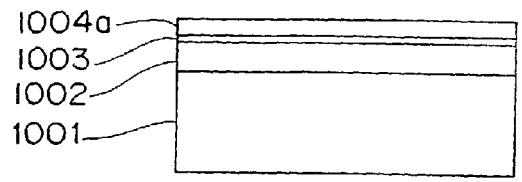
FIG. 15A through FIG. 15D are explanatory views showing a production process for the semiconductor laser element of the prior art.
Figure 15B:
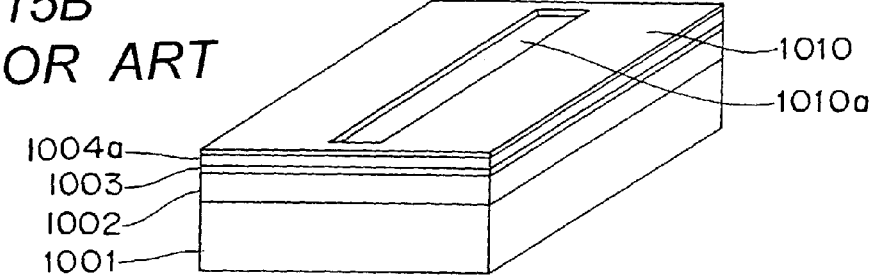
Figure 15C:
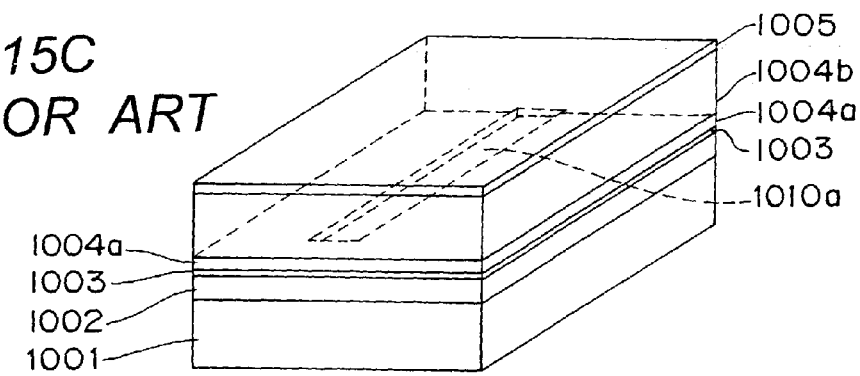
Figure 15D:
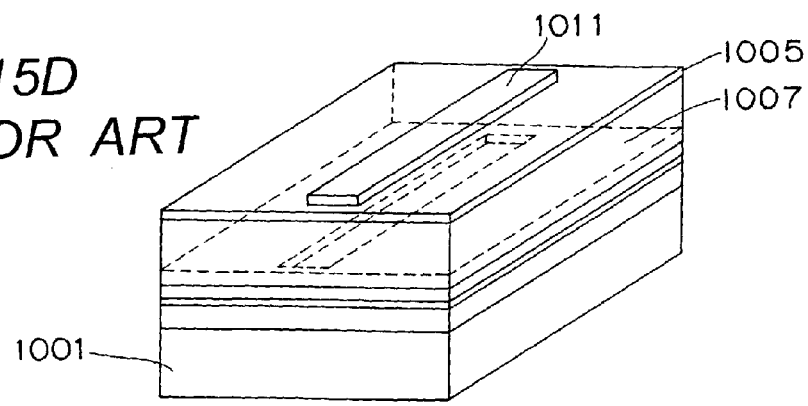

Thereafter, as shown in FIG. 11F, the resist mask 321 on the n-type AlxInzP current block layer 310 is removed, and the p-type GaAs contact layer 311 is formed by the MBE method. Furthermore, the p-electrode 312 is formed on the upper surface of the resulting wafer, while the n-electrode 313 is formed on the lower surface of the wafer.

Next, scribe lines are drawn at an approximate center in the lengthwise direction of each region K (40 μm-wide) in the vicinity of the end faces of the laser resonator J to divide the wafer into bars having the length of the resonator J. Lastly, both light-emitting end faces of each bar are coated with a reflection film and further divided into chips. In this way, semiconductor laser elements having the about 20-μm window regions 314 and current non-injection regions 315 in the end portions of the resonator J 800 μm long are provided.

Characteristics of the semiconductor laser element obtained by the production process according the third embodiment were measured. For comparison, characteristics of the semiconductor laser element fabricated in the same manner as in the third embodiment, except that the interface region 317 containing oxygen atoms was not formed in the latter, were also measured.

As a result, the semiconductor laser element of the third embodiment had an oscillation wavelength (λ) of 660 nm at CW 50 mW, while the semiconductor laser element of the comparative example had an oscillation wavelength (λ) of 655 nm at CW 50 mW. The operation current (Iop) at CW 50 mW of the semiconductor laser element of the third embodiment was 110 mA, while that of the semiconductor laser element of the comparative example was 130 mA. That is, the production process for the semiconductor laser element of the third embodiment was able to suppress the shortening of the oscillation wavelength and, at the same time, to reduce the current at the time of high-output operation.

Although in the third embodiment, the oxygen atom concentration in the interface region 317 in the internal region L of the laser resonator J was set to $7 \times 10^{17}$ cm$^3$, the oxygen atom concentration in that region may be changed in the range between $1 \times 10^{17}$ atoms/cm$^3$ and $1 \times 10^{19}$ atoms/cm$^3$. If the oxygen concentration is within the above range, it is possible to suppress diffusion of atomic vacancies to the active layer 304A in the internal region L of the laser resonator J, and also possible to suppress diffusion of oxygen atoms in the direction toward the substrate. As a result, a variation in the peak wavelength of photoluminescence of the active layer 304A that defines the internal region L of the laser resonator J is suppressed and deterioration of crystallinity of that active layer 304A is also suppressed.

In the third embodiment, the $Si_xO_y$ ($x \geq 1$ and $y \geq 1$) film 319 serving as a dielectric film and also as an oxide film was used. However, alternatively either $Al_xO_y$ or $Si_xO_yN_z$ ($x \geq 1$, $y \geq 1$, and $z \geq 1$) may also be used. These materials can also diffuse oxygen atoms below the internal region of the laser resonator and produce vacancies in the p-type GaAs protective layer 309 in the regions K in the vicinity of the end faces of the laser resonator J. Accordingly, the window regions 314 having a bandgap width effectively wider than that of the active layer (the active region) 304A in the internal region L of the laser resonator J can be well formed in the regions K in the vicinity of the end faces of the laser resonator J.

In the third embodiment, ion irradiation using $Si_xN_y$ ($x \geq 1$, $y \geq 1$) cluster ions was conducted in the step of irradiating the p-type GaAs protective layer 309 in the internal region L of the laser resonator J. Similar effects can be obtained even in the case of irradiation using other kinds of cluster ions such as $Si_xO_y$.

The third embodiment has been described in connection with the $Al_xGa_yIn_zP$ ($0 \leq x \leq 1$, $0 \leq y \leq 1$ and $0 \leq z \leq 1$) semiconductor lasers. Similar effects can be obtained even when the present invention is applied to $Al_xGa_yAs$ ($0 \leq x \leq 1$ and $0 \leq y \leq 1$) semiconductor lasers.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser element comprising a semiconductor substrate, an active layer formed above the semiconductor substrate, and a plurality of semiconductor layers laid on the active layer, wherein
   at least one of the plurality of semiconductor layers forms a ridge stripe extending in a lengthwise direction of a laser resonator;
   said ridge stripe has a semiconductor layer interface containing oxygen atoms which is located above the active layer at least in an internal region of the laser resonator of the semiconductor laser element; and
   a peak wavelength of photo luminescence of the active layer in a region in the vicinity of an end face of the laser resonator is shorter than a peak wavelength of photoluminescence of the active layer in the internal region of the laser resonator.

2. The semiconductor laser element according to claim 1, wherein vacancies are diffused in the active layer in the region in the vicinity of the end face of the laser resonator, whereby the peak wavelength of photoluminescence of the active layer in the region in the vicinity of the end face is shorter than that of the active layer in the internal region.

3. The semiconductor laser element according to claim 1, wherein the semiconductor layer interface containing oxygen atoms is present below a regrowth interface.

4. A semiconductor laser element comprising a semiconductor substrate, an active layer formed above the semiconductor substrate, and a plurality of semiconductor layers laid on the active layer, wherein
   a semiconductor layer interface containing oxygen atoms is located above the active layer at least in an internal region of a laser resonator of the semiconductor laser element;
   a peak wavelength of photoluminescence of the active layer in a region in the vicinity of an end face of the laser resonator is shorter than a peak wavelength of photoluminescence of the active layer in the internal region of the laser resonator; and
   the semiconductor layer interface has an oxygen atom concentration that is higher in the internal region of the laser resonator than in the region in the vicinity of the end face of the laser resonator.

5. The semiconductor laser element according to claim 4, wherein the oxygen atom concentration at the semiconductor layer interface in the internal region of the laser resonator is in a range of $1 \times 10^{17}$ atoms/cm$^3$–$1 \times 10^{19}$ atoms/cm$^3$, inclusive.

6. A semiconductor laser element comprising a semiconductor substrate, an active layer formed above the semiconductor substrate, and a plurality of semiconductor layers laid on the active layer, wherein
   a semiconductor layer interface containing oxygen atoms is located above the active layer at least in an internal region of a laser resonator of the semiconductor laser element;
   a peak wavelength of photoluminescence of the active layer in a region in the vicinity of an end face of the laser resonator is shorter than a peak wavelength of photoluminescence of the active layer in the internal region of the laser resonator; and
   the regrowth interface in the internal region of the laser resonator has an oxygen concentration lower than that of the semiconductor layer interface containing oxygen atoms in the internal region of the laser resonator.

7. A semiconductor laser element comprising a semiconductor substrate, an active layer formed above the semiconductor substrate, and a plurality of semiconductor layers laid on the active layer, wherein
   a semiconductor layer interface containing oxygen atoms is located above the active layer at least in an internal region of a laser resonator of the semiconductor laser element;
   a peak wavelength of photoluminescence of the active layer in a region in the vicinity of an end face of the laser resonator is shorter than a peak wavelength of photoluminescence of the active layer in the internal region of the laser resonator; and
   the semiconductor layer interface containing oxygen atoms is sandwiched between a semiconductor layer containing Al atoms and a semiconductor layer containing no Al atoms, and the semiconductor layer containing Al atoms is located below the semiconductor layer containing no Al atoms.

8. The semiconductor laser element according to claim 1, wherein the semiconductor substrate is of first-conductive-type and the active layer has a multiquantum well structure, wherein at least a first-conductive-type cladding layer, the active layer, a second-conductive-type lower cladding layer, and a second-conductive-type upper cladding layer having the ridge stripe extending in the lengthwise direction of the laser resonator are provided on or above the first-conductive-type semiconductor substrate, and wherein the semiconductor layer interface containing oxygen atoms is formed on the second-conductive-type upper cladding layer.

9. The semiconductor laser element according to claim 8, wherein the second-conductive-type upper cladding layer is a semiconductor layer containing Al atoms, a semiconductor layer containing no Al atoms is provided on the second-conductive-type upper cladding layer, and the semiconductor layer interface containing oxygen atoms is sandwiched between the second-conductive-type upper cladding layer and the semiconductor layer containing no Al atoms.

10. A process for producing a semiconductor laser element, comprising:
   epitaxially growing semiconductor layers on or above a first-conductive-type semiconductor substrate of a wafer, said semiconductor layers including at least a first-conductive-type cladding layer, an active layer having a multiquantum well structure, a second-conductive-type lower cladding layer, and a second-conductive-type upper cladding layer;

forming a semiconductor layer interface containing oxygen atoms on the second-conductive-type upper cladding layer in an internal region of a laser resonator of the wafer having the epitaxially grown semiconductor layers; and making a peak wavelength of photoluminescence of the active layer of the wafer in a region in the vicinity of an end face of the laser resonator shorter than that of the active layer in the internal region of the laser resonator.

11. The process for producing a semiconductor laser element according to claim 10, wherein the step of forming a semiconductor layer interface containing oxygen atoms on the second-conductive-type upper cladding layer in an internal region of a laser resonator of the wafer having the epitaxially grown semiconductor layers comprises:

forming a damaged layer at a surface of the wafer in the internal region of the laser resonator;

forming an oxide film on or above the surface of the wafer in the internal region of the laser resonator; and annealing the wafer to diffuse oxygen atoms below the oxide film.

12. The process for producing a semiconductor element according to claim 11, further comprising, after the step of annealing the wafer, removing the damaged layer and the oxide layer from the wafer.

13. The process for producing a semiconductor laser element according to claim 10, wherein the step of making a peak wavelength of photoluminescence of the active layer of the wafer in a region in the vicinity of an end face of the laser resonator shorter than that of the active layer in the internal region of the laser resonator comprises:

forming a dielectric film in the region in the vicinity of the end face of the laser resonator of the wafer; and annealing the wafer to produce vacancies below the dielectric film and diffuse the vacancies into the active layer.

14. A process for producing a semiconductor laser element comprising:

epitaxially growing semiconductor layers on or above a first-conductive-type semiconductor substrate of a wafer, said semiconductor layers including at least a first-conductive-type cladding layer, an active layer having a multiquantum well structure, a second-conductive-type lower cladding layer, and a second-conductive-type upper cladding layer;

forming a damaged layer at a surface of the wafer having the semiconductor layers epitaxially grown, in an internal region of the laser resonator;

forming an oxide film on or above the surface of the wafer in the internal region of the laser resonator as well as in a region in the vicinity of an end face of the laser resonator; and annealing the wafer to diffuse oxygen atoms below the oxide film and to make a peak wavelength of photoluminescence of the active layer of the wafer in the region in the vicinity of the end face of the laser resonator shorter than that of the active layer in the internal region of the laser resonator.

15. The process for producing a semiconductor laser element according to claim 14, further comprising, after annealing the wafer, removing the damaged layer and the oxide layer from the wafer.

16. The process for producing a semiconductor laser element according to claim 10, wherein the step of epitaxially growing semiconductor layers comprises forming a protective layer made of a semiconductor layer containing no Al atoms on the second-conductive-type upper cladding layer, and the protective layer defines a surface of the wafer after the epitaxial growth.

17. The process for producing a semiconductor laser element according to claim 14, wherein the step of epitaxially growing semiconductor layers comprises forming a protective layer made of a semiconductor layer containing no Al atoms on the second-conductive-type upper cladding layer, and the protective layer defines a surface of the wafer after the epitaxial growth.

18. The process for producing a semiconductor laser element according to claim 10, further comprising partially removing the second-conductive-type upper cladding layer and the semiconductor layer interface containing oxygen atoms to thereby form a ridge stripe which at least comprises the remaining second-conductive-type upper cladding layer and the remaining semiconductor layer interface containing oxygen atoms and which extends in a lengthwise direction of a laser resonator.

19. The process for producing a semiconductor laser element according to claim 14, wherein said annealing the wafer comprises forming a semiconductor layer interface containing oxygen atoms on the second-conductive-type upper cladding layer.

20. The process for producing as semiconductor laser element according to claim 19, further comprising partially removing the second-conductive-type upper cladding layer and the semiconductor layer interface containing oxygen atoms to thereby form a ridge stripe which at least comprises the remaining second-conductive-type upper cladding layer and the remaining semiconductor layer interface containing oxygen atoms and which extends in a lengthwise direction of a laser resonator.

* * * * *